US010287684B2

(12) United States Patent
Yanai

(10) Patent No.: US 10,287,684 B2
(45) Date of Patent: May 14, 2019

(54) SUBSTRATE PROCESSING APPARATUS

(71) Applicant: HITACHI KOKUSAI ELECTRIC INC., Tokyo (JP)

(72) Inventor: Hidehiro Yanai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 769 days.

(21) Appl. No.: 14/790,393

(22) Filed: Jul. 2, 2015

(65) Prior Publication Data

US 2016/0010210 A1  Jan. 14, 2016

(30) Foreign Application Priority Data

Jul. 8, 2014  (JP) ................................ 2014-140494

(51) Int. Cl.
  *C23C 16/455*  (2006.01)
  *C23C 16/52*  (2006.01)
  *C23C 16/44*  (2006.01)

(52) U.S. Cl.
  CPC .... *C23C 16/45574* (2013.01); *C23C 16/4408* (2013.01); *C23C 16/45557* (2013.01); *C23C 16/52* (2013.01)

(58) Field of Classification Search
  CPC . C23C 16/303; C23C 16/325; C23C 16/4401; C23C 16/4408; C23C 16/45504;
  (Continued)

(56) References Cited

U.S. PATENT DOCUMENTS 4,590,042 A * 5/1986 Drage ................ H01J 37/3244
   156/345.34
5,200,232 A * 4/1993 Tappan .............. C23C 16/4401
   118/719

(Continued)

FOREIGN PATENT DOCUMENTS

JP  2005-507030 A  3/2005
JP  2005-142355 A  6/2005
(Continued)

OTHER PUBLICATIONS

Japanese Office Action for Application No. 2014-140494 dated Mar. 19, 2015 [English Translation Included].
Taiwanese Office Action dated Aug. 8, 2016.

*Primary Examiner* — Jeffrie R Lund
*Assistant Examiner* — Stanislav Antolin
(74) *Attorney, Agent, or Firm* — Volpe and Koenig, P.C.

(57) ABSTRACT

A substrate processing apparatus includes a process chamber including a process space configured to accommodate a substrate; a substrate support part including a substrate mounting stand; a first gas supply part; a second gas supply part; a gas introduction port configured to introduce a gas from the first gas supply part or the second gas supply part; a gas rectifying part including an opening through which the gas introduced from the gas introduction port passes; a gas flow passage communicated with the opening and formed between the gas rectifying part and an outer periphery of the substrate mounting stand in a circumferential direction; a gas pressure equalizing part including at least two gas pressure equalizing spaces; a purge gas supply part configured to supply different amount of a purge gas to each of the at least two gas pressure equalizing spaces; and a conductance adjustment part.

16 Claims, 15 Drawing Sheets

(58) Field of Classification Search
CPC ........ C23C 16/45519; C23C 16/45525; C23C 16/45548; C23C 16/45553; C23C 16/45557; C23C 16/45565; C23C 16/45574; C23C 16/45582; C23C 16/45587; C23C 16/45591; C23C 16/4584; C23C 16/4586; C23C 16/52; C30B 25/14; C30B 25/165; C30B 29/36; H01L 21/0228; H01L 21/02529; H01L 21/02576; H01L 21/02579; H01L 21/02598; H01L 21/0262; H01L 21/3141; Y10T 137/0396
See application file for complete search history.

(56) References Cited

U.S. PATENT DOCUMENTS

| | | | | |
|---|---|---|---|---|
| 5,422,139 | A * | 6/1995 | Fischer | C23C 16/455 118/715 |
| 5,453,124 | A * | 9/1995 | Moslehi | C23C 16/45561 118/715 |
| 5,595,606 | A * | 1/1997 | Fujikawa | C23C 16/45561 118/715 |
| 5,792,272 | A * | 8/1998 | van Os | C23C 16/4405 118/723 I |
| 6,059,885 | A * | 5/2000 | Ohashi | C23C 16/4401 118/715 |
| 6,103,304 | A * | 8/2000 | Mizuno | C23C 16/4412 118/715 |
| 6,125,788 | A * | 10/2000 | Hills | H01J 37/32082 118/723 MP |
| 7,648,578 | B1 * | 1/2010 | Itatani | C23C 16/4412 118/715 |
| 8,506,713 | B2 | 8/2013 | Takagi | |
| 8,945,306 | B2 | 2/2015 | Tsuda | |
| 2001/0052322 | A1 * | 12/2001 | Hirayama | C23C 16/45565 118/723 MW |
| 2002/0052097 | A1 * | 5/2002 | Park | C23C 16/45544 438/507 |
| 2002/0129768 | A1 * | 9/2002 | Carpenter | C23C 16/45544 118/715 |
| 2003/0000473 | A1 * | 1/2003 | Chae | C23C 16/45548 118/715 |
| 2003/0054099 | A1 * | 3/2003 | Jurgensen | C23C 14/0015 427/248.1 |
| 2003/0056720 | A1 * | 3/2003 | Dauelsberg | C23C 16/45514 117/200 |
| 2003/0079686 | A1 * | 5/2003 | Chen | C23C 16/34 118/715 |
| 2003/0094903 | A1 * | 5/2003 | Tao | C23C 16/45565 315/111.91 |
| 2003/0221780 | A1 * | 12/2003 | Lei | C23C 16/4412 156/345.29 |
| 2004/0083959 | A1 * | 5/2004 | Carpenter | C23C 16/45519 118/715 |
| 2004/0134611 | A1 * | 7/2004 | Kato | C23C 16/455 156/345.33 |
| 2004/0231799 | A1 * | 11/2004 | Lee | C23C 16/4412 156/345.34 |
| 2005/0139160 | A1 * | 6/2005 | Lei | C23C 16/4412 118/715 |
| 2005/0263484 | A1 * | 12/2005 | Park | H01J 37/32623 216/59 |
| 2006/0090705 | A1 * | 5/2006 | Kim | C23C 14/046 118/726 |
| 2009/0014127 | A1 * | 1/2009 | Shah | H01J 37/32366 156/345.29 |
| 2009/0061083 | A1 * | 3/2009 | Chiang | C23C 16/45544 427/248.1 |
| 2009/0061644 | A1 * | 3/2009 | Chiang | C23C 16/45544 438/763 |
| 2009/0061646 | A1 * | 3/2009 | Chiang | C23C 16/45544 438/763 |
| 2009/0142933 | A1 * | 6/2009 | Yajima | H01L 21/67017 438/758 |
| 2009/0156015 | A1 * | 6/2009 | Park | C23C 16/45519 438/758 |
| 2009/0170334 | A1 | 7/2009 | Fang et al. | |
| 2009/0179085 | A1 * | 7/2009 | Carducci | C23C 16/4412 239/289 |
| 2009/0239362 | A1 | 9/2009 | Hirata et al. | |
| 2009/0250004 | A1 * | 10/2009 | Yamada | C23C 16/45514 118/722 |
| 2009/0269506 | A1 * | 10/2009 | Okura | C23C 16/4405 427/534 |
| 2009/0275210 | A1 * | 11/2009 | Shanker | C23C 16/04 438/761 |
| 2010/0279008 | A1 * | 11/2010 | Takagi | C23C 16/409 427/248.1 |
| 2010/0288728 | A1 * | 11/2010 | Han | H01J 37/20 216/41 |
| 2010/0291319 | A1 * | 11/2010 | Yamashita | H01J 37/32495 427/575 |
| 2011/0023782 | A1 * | 2/2011 | Han | C23C 16/45565 118/724 |
| 2011/0155056 | A1 * | 6/2011 | Kato | C23C 16/45538 118/719 |
| 2011/0155057 | A1 * | 6/2011 | Kato | C23C 16/45519 118/719 |
| 2011/0155062 | A1 * | 6/2011 | Kato | C23C 16/45519 118/728 |
| 2011/0159187 | A1 * | 6/2011 | Kato | C23C 16/45544 427/255.26 |
| 2011/0214611 | A1 * | 9/2011 | Kato | C23C 16/45519 118/719 |
| 2011/0226178 | A1 * | 9/2011 | Tsuji | C23C 16/45517 118/50 |
| 2012/0009765 | A1 * | 1/2012 | Olgado | C23C 16/45508 438/478 |
| 2012/0052693 | A1 * | 3/2012 | Ozaki | C23C 16/402 438/771 |
| 2012/0076937 | A1 * | 3/2012 | Kato | C23C 16/45551 427/248.1 |
| 2012/0094011 | A1 * | 4/2012 | Hishiya | C23C 16/40 427/8 |
| 2012/0269968 | A1 * | 10/2012 | Rayner, Jr. | C23C 16/452 427/255.26 |
| 2013/0047923 | A1 * | 2/2013 | Kato | H01L 21/02164 118/723 AN |
| 2013/0059415 | A1 * | 3/2013 | Kato | C23C 16/345 438/106 |
| 2013/0061804 | A1 * | 3/2013 | Enomoto | H01L 21/6719 118/719 |
| 2013/0130512 | A1 * | 5/2013 | Kato | H01L 21/02274 438/765 |
| 2013/0133580 | A1 * | 5/2013 | Wright | C23C 16/4412 118/725 |
| 2013/0164936 | A1 * | 6/2013 | Oshimo | H01L 28/60 438/680 |
| 2013/0164942 | A1 * | 6/2013 | Kato | H01L 21/30 438/758 |
| 2013/0164945 | A1 * | 6/2013 | Furuya | H01L 21/02178 438/763 |
| 2013/0180452 | A1 * | 7/2013 | Kato | C23C 16/458 118/719 |
| 2013/0189849 | A1 * | 7/2013 | Kato | H01L 21/0206 438/758 |
| 2013/0253689 | A1 | 9/2013 | Yoneda et al. | |
| 2013/0337658 | A1 * | 12/2013 | Ikegawa | H01L 21/0262 438/782 |
| 2014/0011372 | A1 * | 1/2014 | Kato | H01L 21/02263 438/787 |
| 2014/0048141 | A1 * | 2/2014 | Womack | F17D 3/00 137/9 |
| 2014/0209028 | A1 * | 7/2014 | Oshimo | H01L 21/68764 118/730 |
| 2014/0273409 | A1 * | 9/2014 | Pitney | C23C 16/45578 438/478 |

(56) References Cited

U.S. PATENT DOCUMENTS

| | | | |
|---|---|---|---|
| 2014/0370691 A1* | 12/2014 | Yamada | C30B 25/14 |
| | | | 438/478 |
| 2015/0041061 A1* | 2/2015 | Shoji | H01J 37/32633 |
| | | | 156/345.29 |
| 2015/0090693 A1* | 4/2015 | Ito | C30B 25/10 |
| | | | 216/79 |
| 2015/0155201 A1* | 6/2015 | Sato | C23C 16/52 |
| | | | 438/680 |
| 2015/0252475 A1* | 9/2015 | Lin | C23C 16/45565 |
| | | | 438/758 |

FOREIGN PATENT DOCUMENTS

| | | | | |
|---|---|---|---|---|
| JP | 2005142355 A | * | 6/2005 | H01L 21/31 |
| JP | 2008-218734 A | | 9/2008 | |
| JP | 2009-88473 A | | 4/2009 | |
| JP | 2009-224775 A | | 10/2009 | |
| JP | 2009-231587 A | | 10/2009 | |
| JP | 2010-272765 A | | 12/2010 | |
| JP | 2014-074190 A | | 4/2014 | |
| JP | 2015002209 A | * | 1/2015 | C30B 25/14 |
| JP | 2015073000 A | * | 4/2015 | C30B 25/10 |
| JP | 2015105410 A | * | 6/2015 | C23C 16/52 |
| TW | 200945436 A1 | | 11/2009 | |
| TW | 201351533 A1 | | 12/2013 | |
| WO | 2003/035927 A2 | | 5/2003 | |

\* cited by examiner

SUBSTRATE PROCESSING APPARATUS

CROSS-REFERENCE TO RELATED APPLICATION

This application is based upon and claims the benefit of priority from Japanese Patent Application No. 2014-140494, filed on Jul. 8, 2014, the entire contents of which are incorporated herein by reference.

TECHNICAL FIELD

The present disclosure relates to a substrate processing apparatus.

BACKGROUND

With an increase in the density of large scale integrated circuits (hereinafter, referred to as an LSI), circuit patterns are being miniaturized.

In order to integrate a large number of semiconductor devices into a small area, the semiconductor devices must be formed to be small in size. To this end, widths and spaces of patterns to be formed should be made small.

With the current trend of miniaturization, microstructure embedding, particularly, oxide embedding a narrow void structure (groove) which is deep in a vertical direction or narrow in a width direction has reached its technical limits when the embedding of the oxide is performed by a CVD method. In addition, with the miniaturization of transistors, a thin and uniform gate insulating film or gate electrode is required to be formed. Further, it is required to reduce the processing time per substrate in order to improve productivity of semiconductor devices.

Further, in order to increase the productivity of semiconductor devices, it is required to improve the processing uniformity for the entire surface a substrate.

SUMMARY

As the minimum process dimension of semiconductor devices, represented by LSI, DRAM (Dynamic Random Access Memory) or Flash Memory, has become smaller than 30 nm width and the film thickness has become thinner, it has become difficult to improve miniaturization, enhance manufacture throughput, or enhance processing uniformity for a substrate, while maintaining the quality of the product.

The object of the present disclosure is to provide a substrate processing apparatus, a method of manufacturing a semiconductor device, and a gas rectifying part, which makes it possible to improve the properties of a film that is formed on a substrate or the processing uniformity for a substrate surface, and to improve the manufacturing throughput as well.

According to an aspect of the present disclosure, there is provided a substrate processing apparatus, including: a process chamber including a process space configured to accommodate a substrate; a substrate support part installed in the process chamber, the substrate support part including a substrate mounting stand; a first gas supply part configured to supply a first gas to the substrate; a second gas supply part configured to supply a second gas to the substrate; a gas introduction port installed in the process chamber, the gas introduction port being configured to introduce a gas from the first gas supply part or the second gas supply part; a gas rectifying part installed between the gas introduction port and the process space, the gas rectifying part including an opening through which the gas introduced from the gas introduction port passes; a gas flow passage communicated with the opening and formed between the gas rectifying part and an outer periphery of the substrate mounting stand in a circumferential direction; a gas pressure equalizing part including at least two gas pressure equalizing spaces; a purge gas supply part configured to supply different amount of a purge gas to each of the at least two gas pressure equalizing spaces; and a conductance adjustment part installed with the gas pressure equalizing part, wherein the conductance adjustment part is configured to adjust the supply amount of the purge gas supplied to a portion of an outer periphery end of the substrate mounting stand through one of the gas pressure equalizing spaces to be larger than the supply amount of the purge gas supplied to another portion of the outer periphery end through another one of the gas pressure equalizing spaces when a height of the gas flow passage corresponding to the portion of the outer periphery end is higher than a height of the gas flow passage corresponding to the another portion of the outer periphery end.

DETAILED DESCRIPTION

Hereinafter, embodiments of the present disclosure will be described.

<First Embodiment>

Hereinafter, a first embodiment will be described with reference to the relevant drawings.

(1) Configuration of Substrate Processing Apparatus

A substrate processing apparatus according to the first embodiment is described below.

A substrate processing apparatus 100 according to the first embodiment will be described. The substrate processing apparatus 100 is a part for forming an insulating film, a metal film, etc., and is configured as a single-wafer processing type substrate processing apparatus as shown in FIG. 1.

Figure 1:
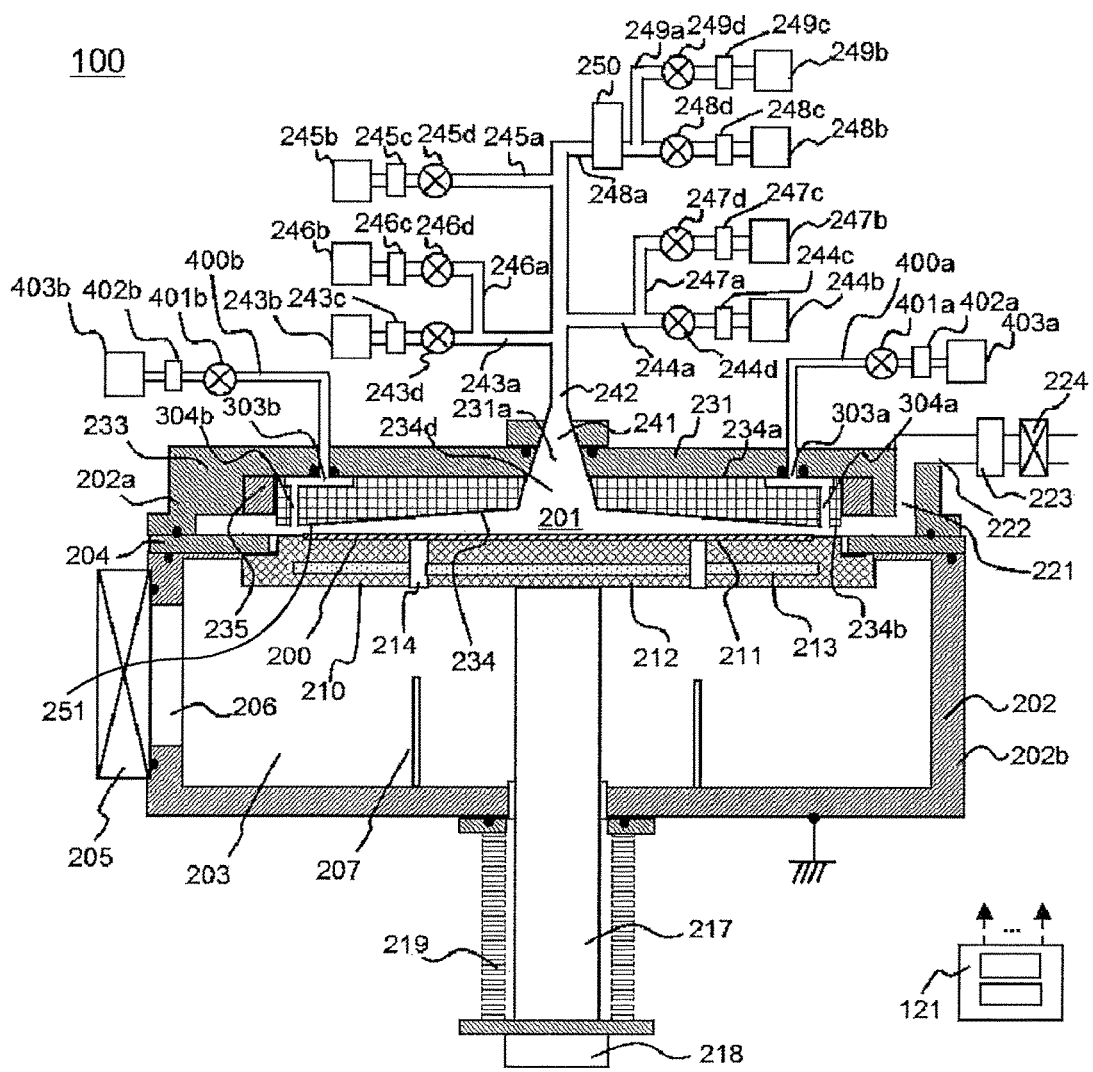
FIG. 1 is a schematic configuration view of a substrate processing apparatus according to one embodiment of the present disclosure.

As shown in FIG. 1, the substrate processing apparatus 100 is provided with a process vessel 202. The process vessel 202 is configured, for example, as a flat airtight vessel having a circular horizontal cross section. In addition, the process vessel 202 is formed of for example, metal, such as aluminum (Al) or stainless steel (SUS), or quartz. A process space (process chamber) 201, in which a wafer 200 such as a silicon wafer as a substrate is processed, and a transfer space 203 are formed in the process vessel 202. The process vessel 202 comprises an upper vessel 202a and a lower vessel 202b. A partition plate 204 is installed between the upper vessel 202a and the lower vessel 202b. A space above the partition plate 204 that is surrounded by the upper vessel 202a is referred to as the process space 201, and a space below the partition plate 204 that is surrounded by the lower vessel 202b is referred to as the transfer space 203.

A substrate loading/unloading port 206 is installed adjacent to a gate valve 205 in a side surface of the lower vessel 202b, and the wafer 200 moves into and out of a transfer chamber (not shown) through the substrate loading/unloading port 206. A plurality of lift pins 207 is installed in a bottom portion of the lower vessel 202b. In addition, the lower vessel 202b is in a ground potential.

A substrate support part 210 configured to support the wafer 200 is installed inside the process space 201. The substrate support part 210 includes a mounting surface 211 for mounting the wafer 200, a substrate mounting stand 212 having the mounting surface 211 on a surface thereof, and a heater 213 as a heating part contained in the substrate mounting stand 212. Through holes 214 through which the lift pins 207 penetrate are formed at positions in the substrate mounting stand 212 corresponding to the lift pins 207, respectively.

The substrate mounting stand 212 is supported by a shaft 217. The shaft 217 penetrates through a bottom portion of the process vessel 202 and is connected to an elevation mechanism 218 outside the process vessel 202. By operating the elevation mechanism 218 to raise or lower the shaft 217 and the substrate mounting stand 212, the wafer 200 mounted on the mounting surface 211 may be raised or lowered. In addition, the periphery of a lower end of the shaft 217 is covered with a bellows 219, so that an interior of the process space 201 is maintained airtight.

The substrate mounting stand 212 is lowered to the substrate supporting stand when the wafer 200 is to be transferred such that the mounting surface 211 is located at a position of the substrate loading/unloading port 206 (wafer transfer position), and is raised such that the wafer 200 is located at a processing position (wafer processing position) in the process space 201 as shown in FIG. 1 when the wafer 200 is to be processed.

Specifically, as the substrate mounting stand 212 is lowered to the wafer transfer position, upper ends of the lift pins 207 protrude from the upper surface of the mounting surface 211, and the lift pins 207 support the wafer 200 from below. In addition, as the substrate mounting stand 212 is raised to the wafer processing position, the lift pins 207 are drifted apart from the upper surface of the mounting surface 211, and the mounting surface 211 supports the wafer 200 from below. Further, since the lift pins 207 are in direct contact with the wafer 200, they are preferably formed, for example, of quartz, alumina, or the like.

(Exhaust System)

An exhaust port 221 is installed in an inner wall of the process space 201 (the upper vessel 202a) as a first exhaust part configured to exhaust the atmosphere of the process space 201. An exhaust pipe 222 is connected to the exhaust port 221, and a pressure adjuster 223 such as an APC (Auto Pressure Controller) configured to control the interior of the process space 201 to a predetermined pressure, and a vacuum pump 224 are serially connected to the exhaust pipe 222. An exhaust system (exhaust line) 220 is mainly configured of the exhaust port 221, the exhaust pipe 222, and the pressure adjuster 223. In addition, the vacuum pump 224 may also be included as a part of the exhaust system (exhaust line) 220.

(Gas Introduction Port)

A gas introduction port 241 for supplying various types of gases into the process space 201 is installed in an upper surface (ceiling wall) of a gas rectifying part 234, which will be described below. The configuration of a gas supply system connected to the gas introduction port 241 will be described later.

(Gas Rectifying Part)

The gas rectifying part 234 is installed between the gas introduction port 241 and the process space 201. The gas rectifying part 234 includes at least an opening 234d through which a process gas is exhausted. The gas rectifying part 234 is connected to a lid 231 by a fastening member 235. The gas introduction port 241 is connected to the lid 231, and a gas introduced from the gas introduction port 241 is supplied to the wafer 200 through a hole 231a formed in the lid 231 and the gas rectifying part 234. In addition, the gas rectifying part 234 may be configured as a side wall of the chamber lid assembly. Further, the gas introduction port 241 also functions as gas dispersion channel, and the supplied gas is dispersed to the entire periphery of the substrate.

Figure 2:
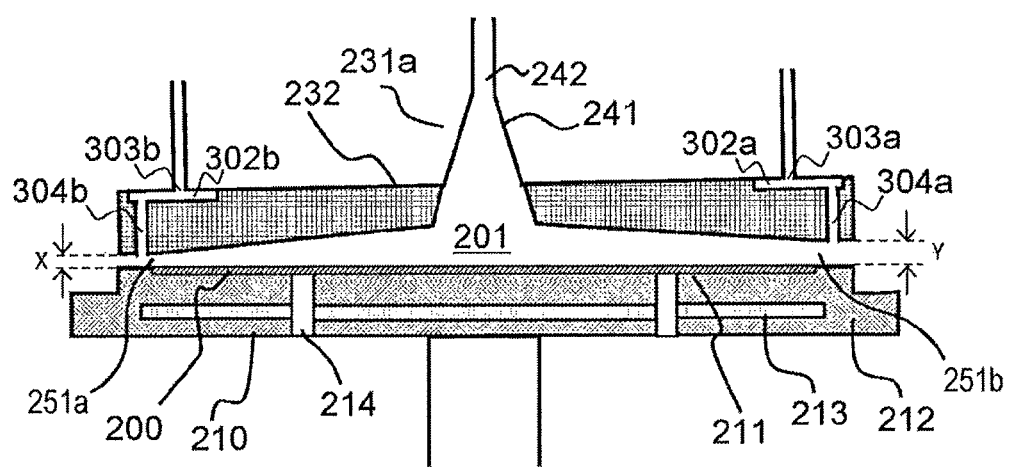
FIG. 2 is a schematic view illustrating the relative position of a substrate mounting stand and a gas rectifying part according to one embodiment of the present disclosure.

Here, the inventors have found, as the cause of degradation of the processing uniformity for the wafer 200 accompanied by a larger-sized wafer 200, the miniaturization and complication of a semiconductor device structure formed in the wafer 200 or the like, the parallelism between the gas rectifying part 234 and the substrate mounting stand 212 being deviated minutely (not in the same parallel plane), as shown in FIG. 2. Herein, the parallelism between the gas rectifying part 234 and the substrate mounting stand 212 refers to height uniformity of a gas passage 251 configured by the outer periphery between the gas rectifying part 234 and the substrate mounting stand 212 in the circumferential direction. Such deviation of the parallelism causes regions to have different conductance in the circumferential direction of the outer periphery of the wafer 200, and the supply or exhaust of a gas becomes non-uniform. In addition, if the substrate size is increased to, for example, 450 mm, it becomes more difficult to precisely adjust the parallelism. For example, the distance X between the gas rectifying part 234 and the substrate mounting stand 212 shown in the left side of FIG. 2 may be shorter than the distance Y shown in the right side of FIG. 2. The distance X is the height of a gas passage 251a that corresponds to a portion of the outer periphery of the substrate mounting stand 212. The distance Y is the height of a gas passage 251b that corresponds to another portion (another region) of the outer periphery of the substrate mounting stand 212 that is different from the gas passage 251a. The distance between the gas rectifying part 234 and the substrate mounting stand 212 may be adjusted to be 0.5 mm to 5 mm. For example, even if the distance between the gas rectifying part 234 and the substrate mounting stand 212 is set to be approximately 2 mm, the distance X may be 1.8 mm while the distance Y is 2.2 mm. In this case, the gas supplied from the gas introduction port 241 flows more in the distance Y side than the distance X side. That is, the gas flowability (conductance) of the distance X side is smaller than the conductance of the distance Y side. As a result, the film thickness of the distance X side is thinner than that of the distance Y side. In addition, even when a film is formed to have a uniform thickness, the film quality may be different in the distance X side and the distance Y side. The difference between the distance X and the distance Y, even in 0.1 mm parts, affects the processing uniformity of the wafer 200. In order to solve the problem of such degradation in the process uniformity, the inventors have conceived of adjusting the gas flowability (conductance) of the outer periphery of the gas rectifying part 234, and have found that the conductance of the outer periphery may be adjusted by installing a conductance adjustment part.

(Conductance Adjustment Part)

The conductance adjustment part is configured by forming, for example, as shown in FIGS. 1 to 4, pressure equalizing part partition plates 301a and 301b, and a first gas pressure equalizing space 302a as a gas pressure equalizing part, a second gas pressure equalizing space 302b, a first gas introduction hole 303a, a second gas introduction hole 303b, a first purge nozzles 304a, and a second purge nozzles 304b in the gas rectifying part 234.

The first gas introduction hole 303a and a plurality of first purge nozzles 304a are installed in the first gas pressure equalizing space 302a, and the second gas introduction hole 303b and a plurality of second purge nozzles 304b are installed in the second gas pressure equalizing space 302b, where the first and second gas pressure equalizing spaces 302a and 302b are partitioned by the pressure equalizing part partition plates 301a and 301b. The purge gas supplied from the first gas introduction hole 303a to the first gas pressure equalizing space 302a is diffused over the entire region of the first gas pressure equalizing space 302a, and is supplied to the plurality of first purge nozzles 304a with equal pressure. Accordingly, the purge gas is supplied to the outer periphery of the wafer 200 uniformly. In addition, the purge gas supplied from the second gas introduction hole 303b is diffused over the entire region of the second gas pressure equalizing space 302b, and is supplied to the plurality of second purge nozzles 304b with equal pressure. Accordingly, the purge gas is supplied to the outer periphery of the wafer 200 uniformly.

Figure 3:
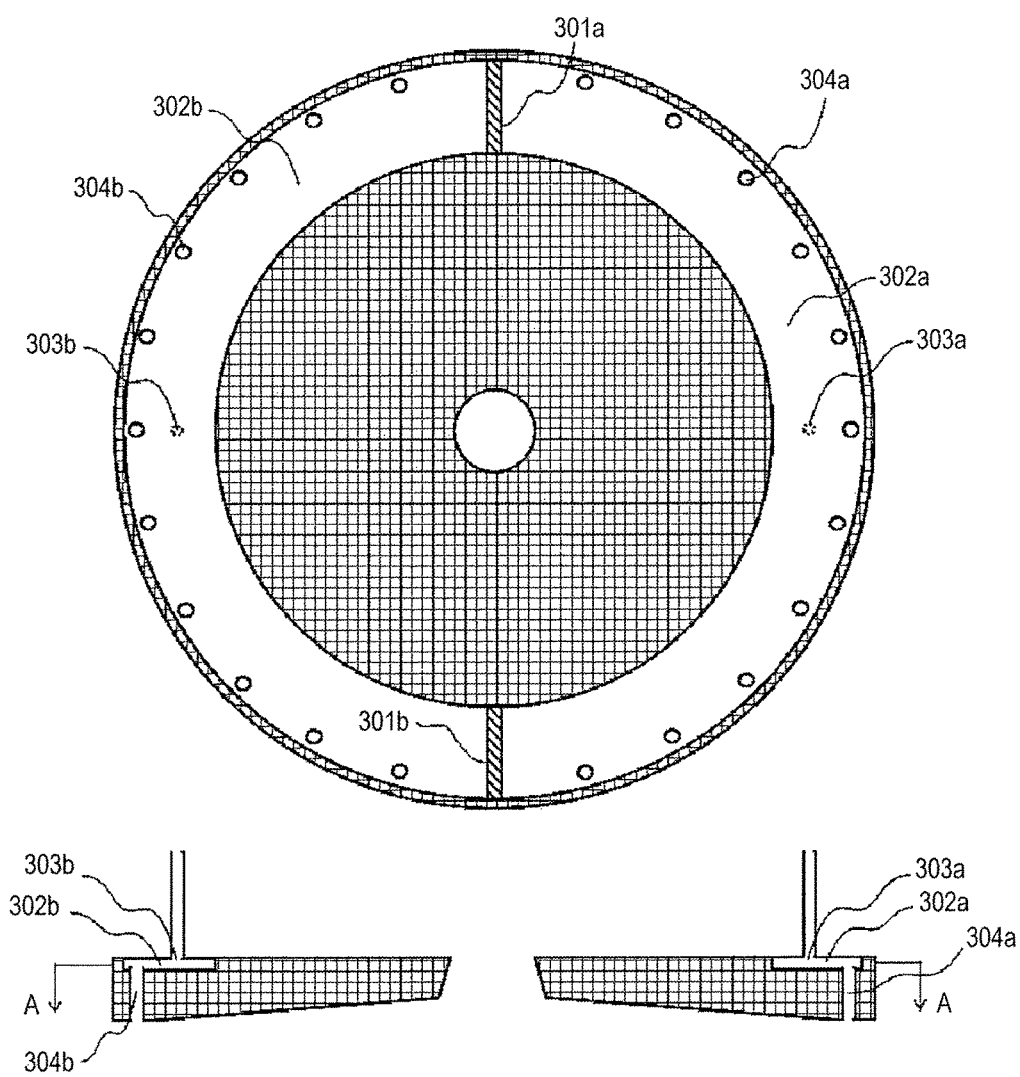
FIG. 3 shows an example of a gas rectifying part and a conductance adjustment part according to one embodiment of the present disclosure.
Figure 4:
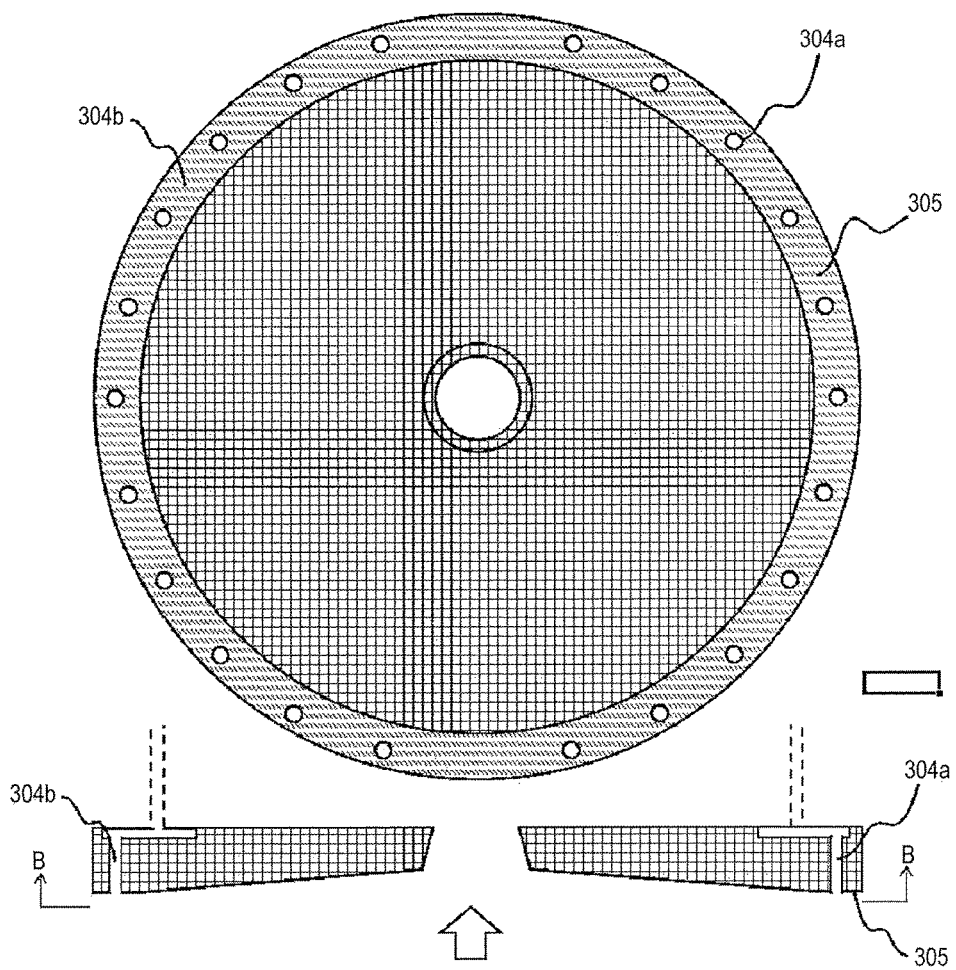
FIG. 4 shows an example of a gas rectifying part and a conductance adjustment part according to one embodiment of the present disclosure.

FIG. 3 is a top sectional view of the gas rectifying part 234 of FIGS. 1 and 2 as viewed from A-A direction, and FIG. 4 is a diagram of the gas rectifying part 234 of FIGS. 1 and 2 as viewed from B-B (downward) direction.

The purge gas is supplied to the first gas introduction hole 303a and the second gas introduction hole 303b, and the first gas introduction hole 303a and the second gas introduction hole 303b are configured to supply the purge gas to the upper surface end of the substrate mounting stand 212. A gas that hardly reacts with the substrate or the first process gas and the second process gas, which will be described later, is used as the purge gas. For example, nitrogen gas, argon gas, helium gas, neon gas, xenon gas or the like is used.

A purge gas with the same flow rate or a purge gas with different flow rates may be supplied to the first gas introduction hole 303a and the second gas introduction hole 303b. For example, a distance between the upper surface end of the substrate mounting stand 212 and the outer periphery of the gas rectifying part 234 may be different depending on locations, and in FIG. 2, the distance at the first gas introduction hole 303a side may be shorter than the distance at the second gas introduction hole 303b side. That is, the height of the gas passage 251b may be higher than that of the gas passage 251a. In this case, the first process gas and the second process gas supplied to the wafer 200 are likely to flow more in the second gas introduction hole 303b side than the first gas introduction hole 303a side, thereby degrading the processing uniformity for the wafer 200. In such a case, it is possible to uniformly supply the first process gas and the second process gas to the surface of the wafer 200 by setting the supply amount of the purge gas to the second gas introduction hole 303b to be greater than the supply amount of the purge gas to the first gas introduction hole 303a.

The gas supplied to the first gas introduction hole 303a and the second gas introduction hole 303b is configured to be supplied from a conductance adjustment gas supply part, which will be described later.

In addition, while an example has been shown where two gas pressure equalizing spaces as a gas pressure equalizing part are installed such that the region of the outer periphery end of the substrate mounting stand 212 to which the purge gas is supplied is formed as two regions (two divisions), the present disclosure is not limited thereto, and three or four gas pressure equalizing parts may be installed to configure many regions, such as, three or four divisions. By configuring multi-divisions, the gas flow rate may be controlled for each region, and the conductance at the outer periphery of the wafer 200 may be adjusted finely, thereby improving the processing uniformity for the wafer 200.

Figure 10:
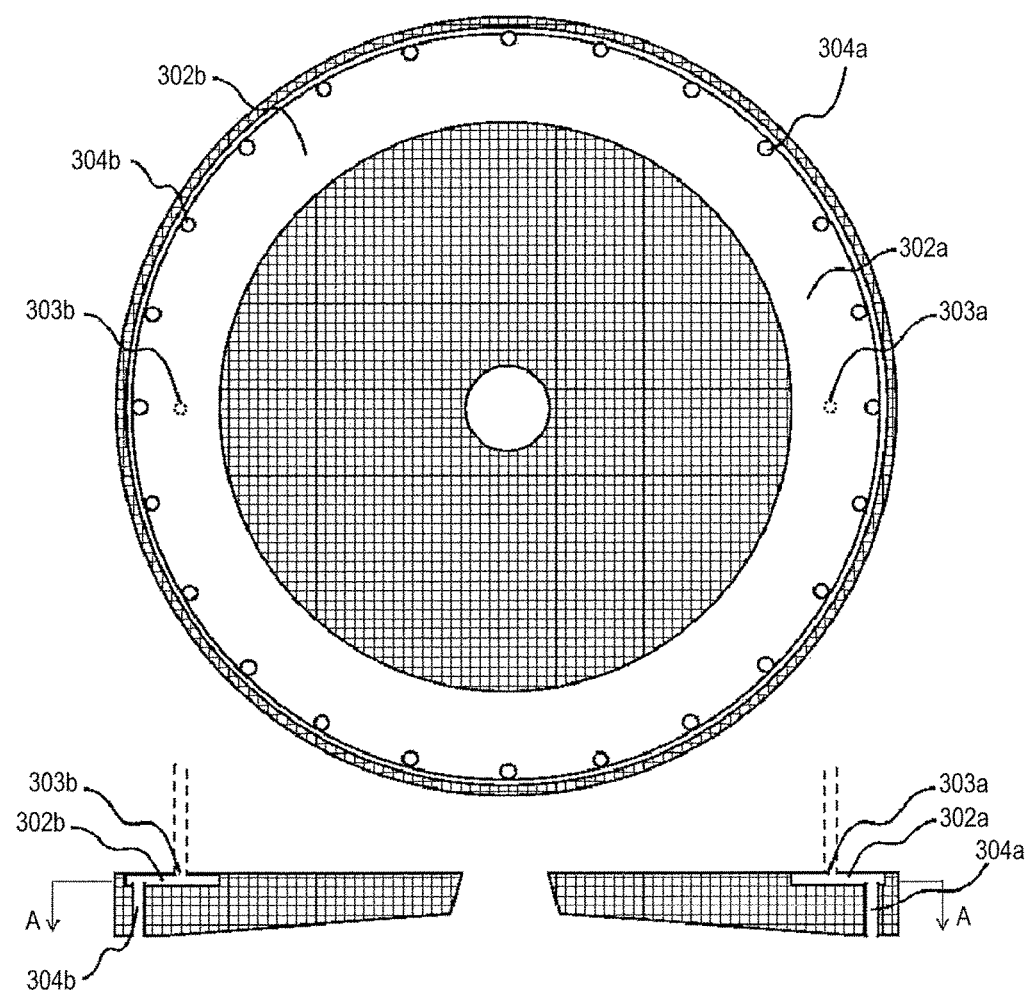
FIG. 10 shows an exemplary gas rectifying part and an exemplary conductance adjustment part according to one embodiment of the present disclosure.

In addition, as shown in FIG. 10, the gas pressure equalizing part may be configured as a single space without installing the pressure equalizing part partition plates 301a and 301b.

Figure 11:
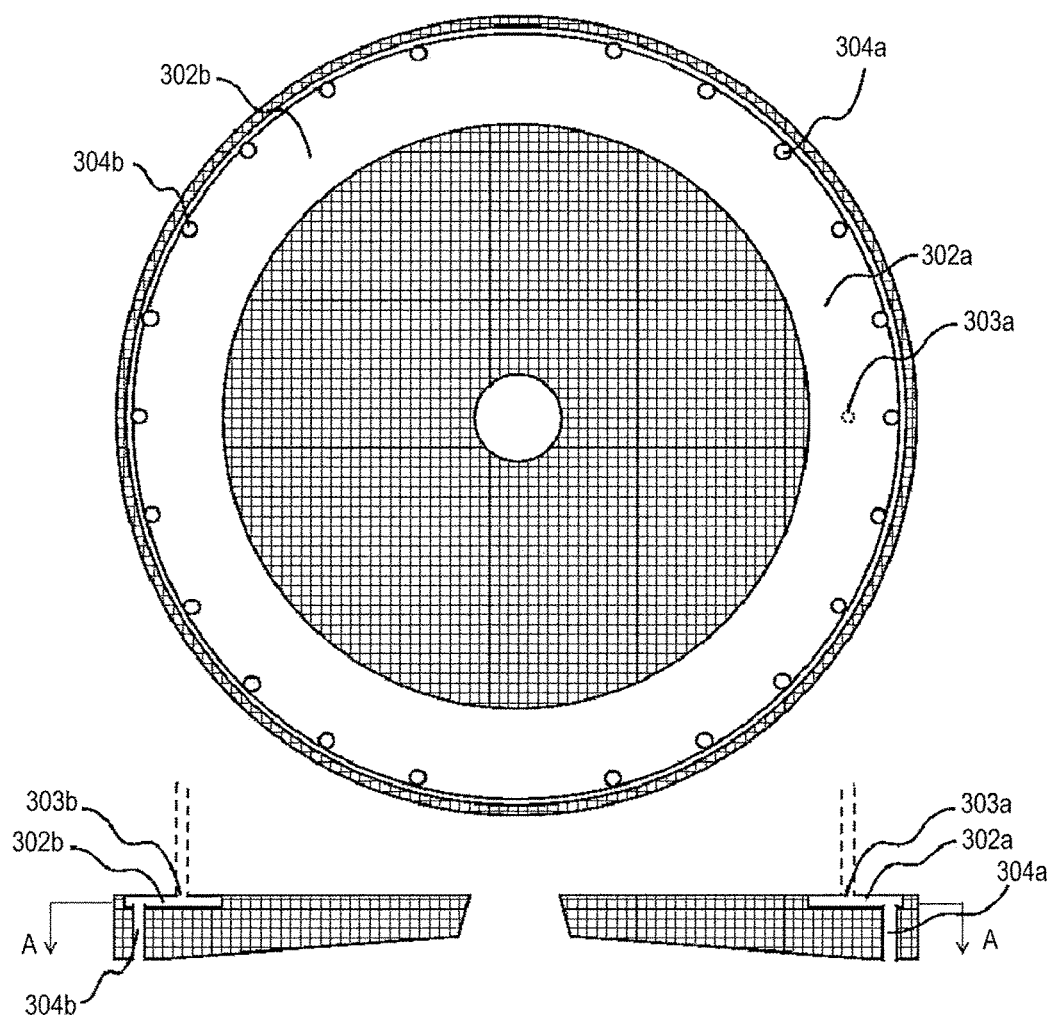
FIG. 11 shows an exemplary gas rectifying part and an exemplary conductance adjustment part according to one embodiment of the present disclosure.

Further, while the first gas introduction hole 303a and the second gas introduction hole 303b are formed in two locations, these may be formed in multiple locations such as in three or four locations. In addition, as shown in FIG. 11, if the gas pressure equalizing part is configured as a single space without installing the pressure equalizing part partition plates 301a and 301b, the first gas introduction hole 303a may be formed in one location to supply gas to the entire circumference of the gas pressure equalizing part 302a.

Moreover, as shown in FIG. 4, the flow (conductance) at the outer periphery side of the wafer 200 may be made uniform by configuring a gas rectifying part edge surface 305, which faces the outer periphery of the substrate mounting stand 212, to be parallel to the substrate mounting stand 212.

(Supply System)

A common gas supply pipe 242 is connected to the gas introduction port 241 connected to the gas rectifying part 234. A first gas supply pipe 243a, a second gas supply pipe 244a, a third gas supply pipe 245a, and a cleaning gas supply pipe 248a are connected to the common gas supply pipe 242.

A first element-containing gas (first process gas) is mainly supplied from a first gas supply system including the first gas supply pipe 243a, and a second element-containing gas (second process gas) is mainly supplied from a second gas supply system including the second gas supply pipe 244a. A purge gas is mainly supplied from a third gas supply system including the third gas supply pipe 245a when processing the wafer 200, and a cleaning gas is mainly supplied form the third gas supply system when cleaning the process chamber.

(First Gas Supply System)

A first gas supply source 243b, a mass flow controller (MFC) 243c, which is a flow rate controller (flow rate control part), and a valve 243d, which is an opening/closing valve, are installed in the first gas supply pipe 243a in this order from the upstream direction.

A gas containing a first element (first process gas) is supplied to the gas rectifying part 234 from the first gas supply source 243b through the mass flow controller 243c, the valve 243d, the first gas supply pipe 243a, and the common gas supply pipe 242.

The first process gas is a precursor gas, i.e., one of process gases. The first element is, for example, silicon (Si). That is, the first process gas is, for example, a silicon-containing gas. The silicon-containing gas may include, for example, a dichlorosilane ($SiH_2Cl_2$: DCS) gas. In addition, the first process gas may be in any one of solid, liquid and gaseous states under the normal temperature and pressure. When the first process gas is in a liquid state under the normal temperature and pressure, a vaporizer (not shown) may be installed between the first gas supply source 243b and the mass flow controller 243c. Herein, a precursor will be described as being in a gaseous state.

A downstream end of the first inert gas supply pipe 246a is connected to the first gas supply pipe 243a at a downstream side of the valve 243d. An inert gas supply source 246b, a mass flow controller (MFC) 246c, which is a flow rate controller (flow rate control part), and a valve 246d, which is an opening/closing valve, are installed in the first inert gas supply pipe 246a in this order from the upstream direction.

The inert gas is, for example, a nitrogen ($N_2$) gas. In addition, the inert gas may include, for example, a rare gas, such as a helium (He) gas, a neon (Ne) gas, and an argon (Ar) gas, in addition to the $N_2$ gas.

The first element-containing gas supply system (referred to as the silicon-containing gas supply system) is mainly configured with the first gas supply pipe 243a, the mass flow controller 243c, and the valve 243d.

In addition, a first inert gas supply system is mainly configured with the first inert gas supply pipe 246a, the mass flow controller 246c, and the valve 246d. The inert gas supply source 246b and the first gas supply pipe 243a may also be included in the first inert gas supply system.

Further, the first gas supply source 243b and the first inert gas supply system may be included in the first element-containing gas supply system.

(Second Gas Supply System)

A second gas supply source 244b, a mass flow controller (MFC) 244c, which is a flow rate controller (flow rate control part), and a valve 244d, which is an opening/closing valve, are installed in an upstream side of the second gas supply pipe 244a in this order from the upstream direction.

A gas containing a second element (hereinafter, referred to as "second process gas") is supplied to the gas rectifying part 234 from the second gas supply source 244b though the mass flow controller 244c, the valve 244d, the second gas supply pipe 244a, and the common gas supply pipe 242.

The second process gas is one of the process gases. In addition, the second process gas may be considered as a reaction gas or a modifying gas.

The second process gas contains a second element other than the first element. The second element includes at least one of, for example, oxygen (O), nitrogen (N), carbon (C), and hydrogen (H). In one embodiment, the second process gas is, for example, a nitrogen-containing gas. Specifically, an ammonia ($NH_3$) gas may be used as the nitrogen-containing gas.

The second process gas supply system is mainly configured with the second gas supply pipe 244a, the mass flow controller 244c, and the valve 244d.

In addition, a downstream end of the second inert gas supply pipe 247a is connected to the second gas supply pipe 244a at the downstream side of the valve 244d. An inert gas supply source 247b, a mass flow controller (MFC) 247c, which is a flow rate controller (flow rate control part), and a valve 247d, which is an opening/closing valve, are installed in the second inert gas supply pipe 247a in this order from the upstream direction An inert gas is supplied to the gas rectifying part 234 from the second inert gas supply pipe 247a through the mass flow controller 247c, the valve 247d, and the second gas supply pipe 244a. The inert gas acts as a carrier gas or a dilution gas in a film forming process (S203 to S207).

A second inert gas supply system is mainly configured with the second inert gas supply pipe 247a, the mass flow controller 247c, and the valve 247d. In addition, the inert gas supply source 247b and the second gas supply pipe 244a may also be included in the second inert gas supply system.

Further, the second gas supply source 244b and the second inert gas supply system may also be included in the second element-containing gas supply system.

(Third Gas Supply System)

A third gas supply source 245b, a mass flow controller (MFC) 245c, which is a flow rate controller (flow rate control part), and a valve 245d, which is an opening/closing valve, are installed in the third gas supply pipe 245a in this order from the upstream direction.

An inert gas as a purge gas is supplied to the gas rectifying part 234 from the third gas supply source 245b though the mass flow controller 245c, the valve 245d, the third gas supply pipe 245a, and the common gas supply pipe 242.

The inert gas is, for example, a nitrogen ($N_2$) gas. In addition, the inert gas may include, for example, a rare gas, such as a helium (He) gas, a neon (Ne) gas, and an argon (Ar) gas, in addition to the $N_2$ gas.

The third gas supply system (referred to as the purge gas supply system) is mainly configured with the third gas supply pipe 245a, the mass flow controller 245c, and the valve 245d.

(Cleaning Gas Supply System)

A cleaning gas source 248b, a mass flow controller (MFC) 248c, a valve 248d, and a remote plasma part (RPU) 250 are installed in a cleaning gas supply pipe 243a in this order from the upstream direction.

A cleaning gas is supplied to the gas rectifying part 234 from the cleaning gas source 248b though the MFC 248c, the valve 248d, the RPU 250, the cleaning gas supply pipe 248a, and the common gas supply pipe 242.

A downstream end of a fourth inert gas supply pipe 249a is connected to the cleaning gas supply pipe 248a at a downstream side of the valve 248d. A fourth inert gas supply source 249b, a MFC 249c, and a valve 249d are installed in the fourth inert gas supply pipe 249a in this order from the upstream direction.

In addition, a cleaning gas supply system is mainly configured with the cleaning gas supply pipe 248a, the MFC 248c, and the valve 248d. The cleaning gas source 248b, the fourth inert gas supply pipe 249a, and the RPU 250 may also be included in the cleaning gas supply system.

Further, the inert gas supplied from the fourth inert gas supply source 249b may be supplied to act as a carrier gas or a dilution gas of the cleaning gas.

In the cleaning process, the cleaning gas supplied from the cleaning gas source 248b acts as a cleaning gas that removes byproducts adhering to the gas rectifying part 234 or the process chamber 201.

The cleaning gas is, for example, a nitrogen trifluoride ($NF_3$) gas. In addition, the cleaning gas may include, for example, a hydrogen fluoride (HF) gas, a chlorine trifluoride ($ClF_3$) gas, a fluorine ($F_2$) gas, and the like, or a combination thereof.

(Conductance Adjustment Gas Supply Part)

As shown in FIG. 1, a conductance adjustment gas supply system that supplies a purge gas is installed in the conductance adjustment part. The conductance adjustment gas supply part is configured with, at least a gas supply pipe 400a, a valve 401a, and an MFC 402a. A gas source 403a may be added to the conductance adjustment gas supply system. The flow rate of the gas supplied from the gas source 403a is controlled in the MFC 402a, then passes the valve 401a, and is supplied to the first gas introduction hole 303a through the gas supply pipe 400a. Further, an MFC 402b, a valve 401b, and a gas supply pipe 400b may be added. In addition, a gas source 403b may be added. As the example described above, since a plurality of pressure equalizing part partition plates are installed to divide the gas pressure equalizing part, and the conductance adjustment gas supply part is installed for each gas pressure equalizing part to control the gas flow rate in the MFC, it is possible to adjust the conductance for each gas pressure equalizing part.

(Control Part)

As shown in FIG. 1, the substrate processing apparatus 100 includes a controller 121 configured to control the operations of the respective parts of the substrate processing apparatus 100.

Figure 5:
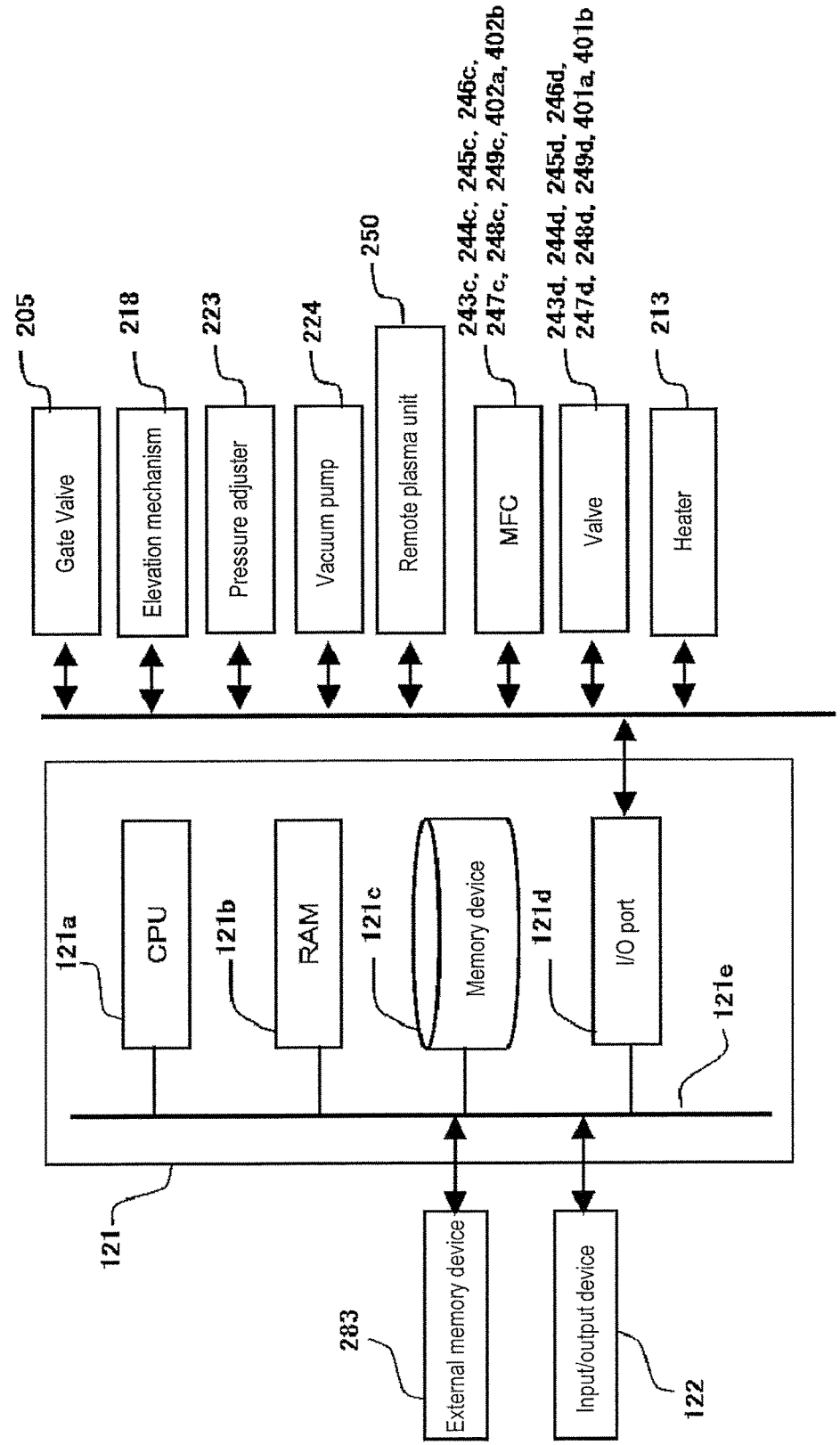
FIG. 5 is a schematic configuration view of a controller according to one embodiment of the present disclosure.

As illustrated in FIG. 5, the controller 121, which is a control part (control means), is configured as a computer including a CPU (Central Processing Part) 121a, a RAM (Random Access Memory) 121b, a memory device 121c, and an I/O port 121d. The RAM 121b, the memory device 121c, and the I/O port 121d are configured to exchange data with the CPU 121a via an internal bus 121e. An input/output device 122 including, for example, a touch panel or the like, or an external memory device 283 is connected to the controller 121.

The memory device 121c is configured with, for example, a flash memory, an HDD (Hard Disc Drive), or the like. A control program for controlling operations of the substrate processing apparatus or a process recipe, in which a sequence or condition for processing a substrate, which will be described later, is readably stored in the memory device 121c. Also, the process recipe functions as a program for the controller 121 to execute each sequence in the substrate processing process, which will be described later, to obtain a predetermined result. Hereinafter, the process recipe or control program may be generally referred to as a program. Also, when the term "program" is used herein, it may include a case in which only the process recipe is included, a case in which only the control program is included, or a case in which both the process recipe and the control program are included. In addition, the RAM 121b is configured as a memory area (work area) in which a program or data read by the CPU 121a is temporarily stored.

The I/O port 121d is connected to the gate valve 205, the elevation mechanism 218, the pressure adjuster 223, the vacuum pump 224, the remote plasma part 250, the MFCs 243c, 244c, 245c, 246c, 247c, 248c, 249c, 402a, and 402b, the valves 243d, 244d, 245d, 246d, 247d, 248d, 249d, 401a, and 401b, the heater 213 and the like.

The CPU 121a is configured to read and execute the control program from the memory device 121c, and read the process recipe from the memory device 121c according to an input of an operation command from the input/output device 122. In addition, the CPU 121a is configured to control the opening/closing operation of the gate valve 205, the elevation operation of the elevation mechanism 218, the pressure adjustment operation of the pressure adjuster 223, the on/off control of the vacuum pump 224, the gas exciting operation of the remote plasma part 250, the flow rate adjustment operation of the MFCs 243c, 244c, 245c, 246c, 247c, 248c, 249c, 402a, and 402b, the on/off control of the gas of valves 243d, 244d, 245d, 246d, 247d, 248d, 249d, 401a, and 401b, the temperature control of the heater 213, and the like according to contents of the read process recipe.

Moreover, the controller 121 is not limited as being configured as a dedicated computer but may be configured as a general-purpose computer. For example, the controller 121 according to one embodiment may be configured with preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program described above is stored, and installing the program on the general-purpose computer using the external memory device 283. Also, a means for providing a program to a computer is not limited to a case in which the program is supplied through the external memory device 283. For example, the program may be supplied using communication means such as the Internet or a dedicated line, rather than through the external memory device 283. Also, the memory device 121c or the external memory device 283 is configured as a non-transitory computer-readable recording medium. Hereinafter, these means for providing the program will be simply referred to as "a recording medium." In addition, when the term "recording medium" is used herein, it may include a case in which only the memory device 121c is included, a case in which only the external memory device 283 is included, or a case in which both the memory device 121c and the external memory device 283 are included.

(2) Substrate Processing Method

Next, a substrate processing method will be described with an example of forming a silicon nitride (SixNy) film using a DCS gas and an ammonia ($NH_3$) gas, which is one of processes for manufacturing a semiconductor device.

Figure 6:
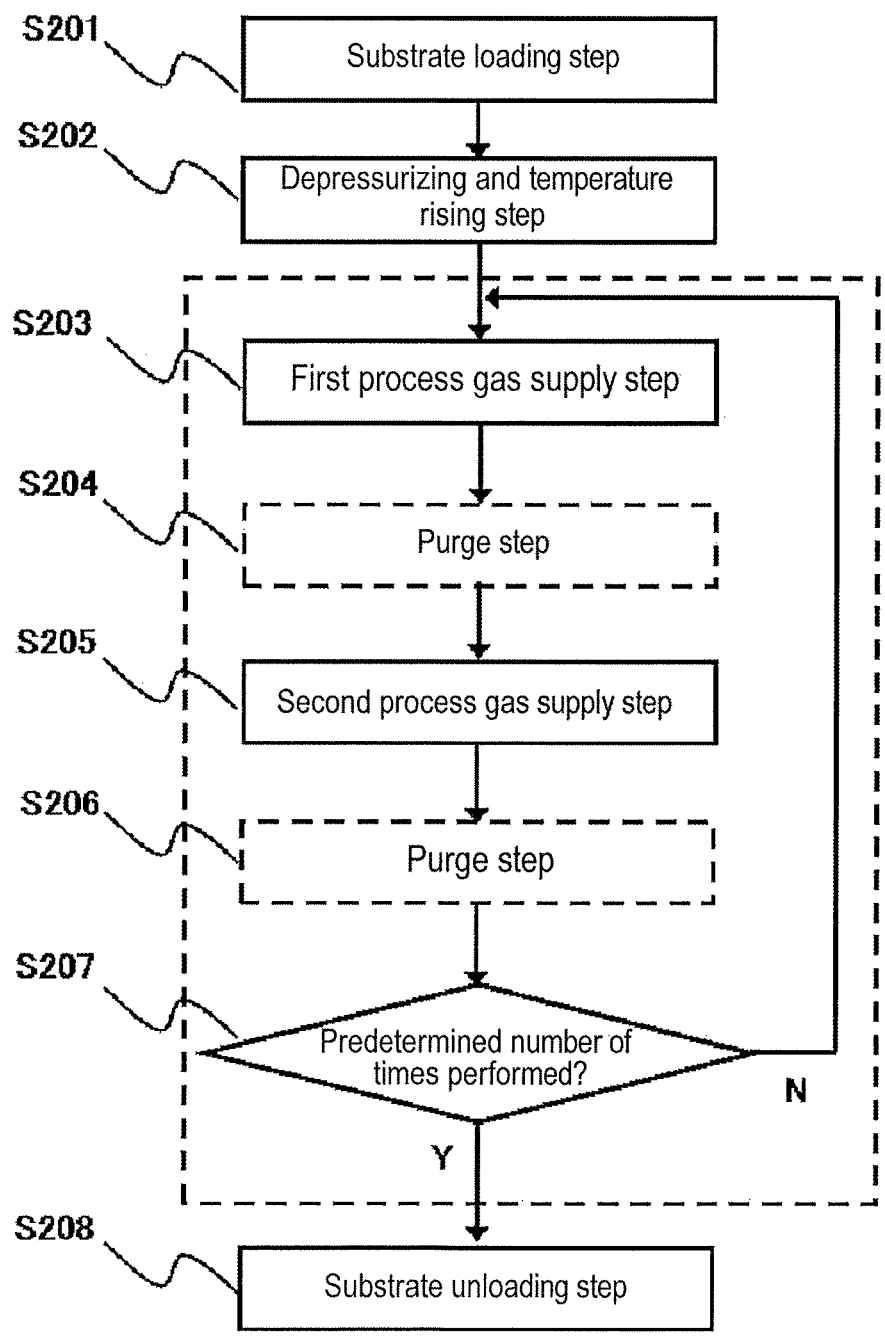
FIG. 6 is a flowchart of a substrate processing method according to one embodiment of the present disclosure.

FIG. 6 is a sequence view illustrating an example of a substrate processing method performed by the substrate processing apparatus according to one embodiment of the present disclosure. The illustrated example shows a sequence operation in which a SixNy film is formed on the wafer 200 as the substrate by performing a process using plasma.

(Substrate Loading Step S201)

When the film forming process is performed, initially, the wafer 200 is loaded into the process chamber 201. Specifically, the substrate support part 210 is lowered by the elevation mechanism 218 to allow the lift pins 207 to protrude from the through holes 214 toward the upper side of the substrate support part 210. In addition, after adjusting the interior of the process chamber 201 to a predetermined pressure, the gate valve 205 is opened and the wafer 200 is mounted on the lift pins 207 from the gate valve 205. After the wafer 200 is mounted on the lift pins 207, the substrate support part 210 is raised to a predetermined position by the elevation mechanism 218, thereby mounting the wafer 200 from the lift pins 207 to the substrate support part 210.
(Depressurizing and Temperature Rising Step S202)

Next, the interior of the process chamber 201 is exhausted through the exhaust pipe 222 such that the interior of the process chamber 201 reaches a desired pressure (vacuum level). At this time, a degree of the valve opening of the APC valve as the pressure adjuster 223 is feedback-controlled based on a pressure value measured by a pressure sensor. In addition, an amount of power supplied to the heater 213 is feedback-controlled based on a temperature value detected by a temperature sensor (not shown) so that the interior of the process chamber 201 is set to a desired temperature. Specifically, a susceptor is heated in advance and is maintained for a predetermined period of time after there is no temperature change in the wafer 200 or the susceptor. In the meantime, the moisture remaining in the process chamber 201 or the gas emitted from members is removed by vacuum exhausting or purging by supplying $N_2$ gas. In this manner, the preparation for the film forming process is completed.
(First Process Gas Supply Step S203)

Figure 7:
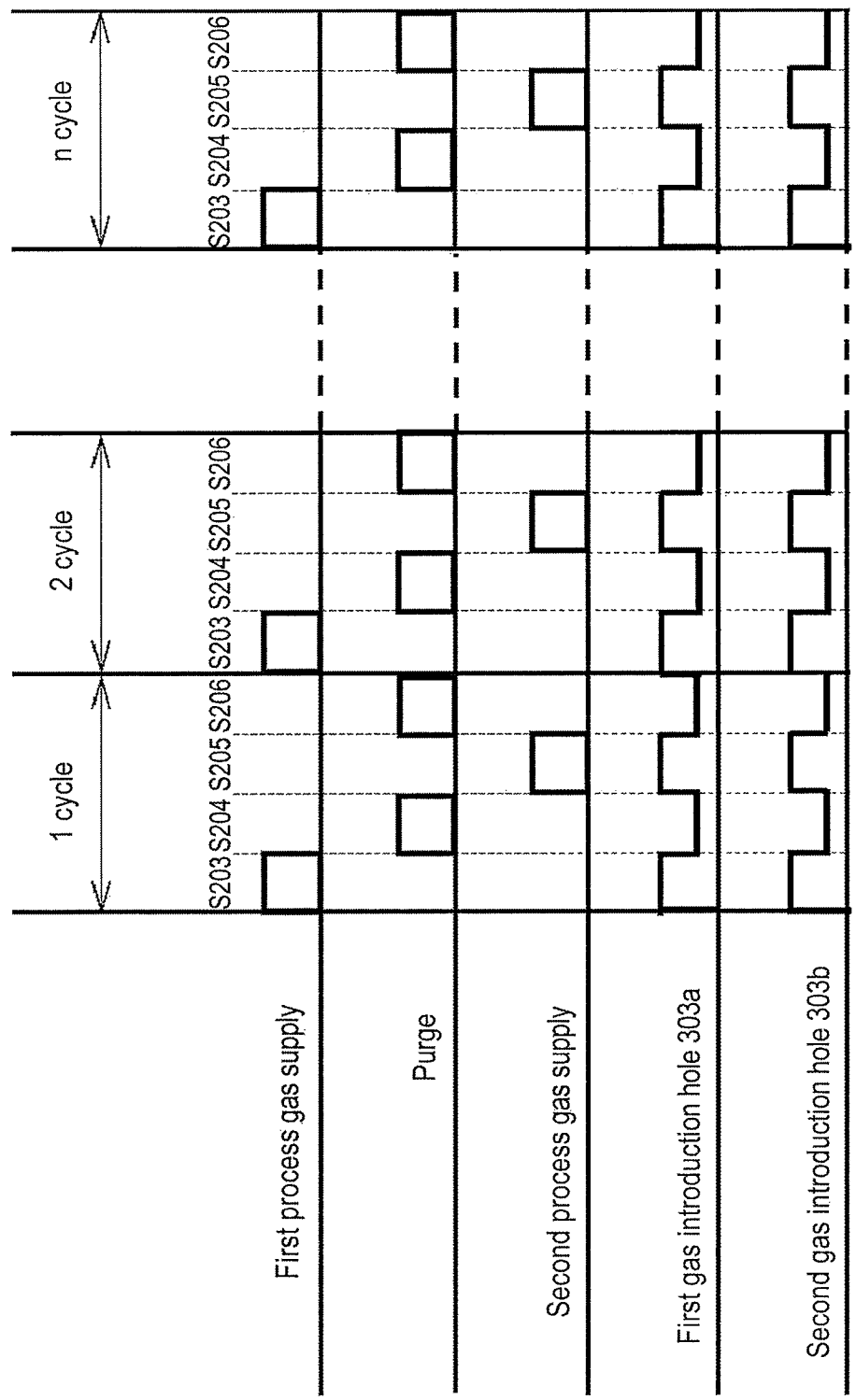
FIG. 7 shows a sequence of a substrate processing method according to one embodiment of the present disclosure.

Subsequently, as shown in FIG. 7, the DCS gas as the first process gas (precursor gas) is supplied into the process chamber 201 from the first process gas supply system. In addition, the interior of the process chamber 201 is exhausted by the exhaust system and the internal pressure of the process chamber 201 is controlled to a predetermined pressure (first pressure). Specifically, the valve 243d of the first gas supply pipe 243a and the valve 246d of the first inert gas supply pipe 246a are opened to flow the DCS gas into the first gas supply pipe 243a and the $N_2$ gas into the first inert gas supply pipe 246a. The DCS gas flows from the first gas supply pipe 243a, and a flow rate of the DCS gas is controlled by the MFC 243c. The $N_2$ gas flows from the first inert gas supply pipe 246a, and a flow rate of the $N_2$ gas is controlled by the mass flow controller 246c. The flow-rate-controlled DCS gas is mixed with the flow-rate-controlled $N_2$ gas in the first gas supply pipe 243a, supplied into the process chamber 201 in a heated and depressurized state from the gas rectifying part 234, and exhausted through the exhaust pipe 222. At this time, the DCS gas is supplied to the wafer 200 (precursor gas (DCS) supply step). The DCS gas is supplied into the process chamber 201 at a predetermined pressure (first pressure: for example, 100 Pa or more to 10000 Pa or less). In this manner, the DCS gas is supplied to the wafer 200. As the DCS gas is supplied, a silicon-containing layer is formed on the wafer 200. The silicon-containing layer is a layer containing silicon (Si), or silicon and chlorine (Cl).

In addition, as shown in FIG. 7, the supply of the purge gas into the first gas introduction hole 303a and the second gas introduction hole 303b is initiated. In FIG. 7, although supplying the purge gas is initiated simultaneously with initiating supply of the precursor gas, the purge gas may be supplied before the supply of the precursor gas. Further, the supply of the purge gas may be delayed after the supply of the precursor gas. The supply of the purge gas is continued until the first process gas supply step S203 or the purge step S206 that is described later. The flow rate of the purge gas is controlled such that, as shown in FIG. 7, the flow rate of the first process gas supply step S203 and the second process gas supply step S205 is greater than the flow rate of the purge steps S204 and S206. With this configuration, while adjusting the conductance at the end of the substrate 200, it is possible to suppress the inhibition of the removal of the first process gas in the purge step S204 and suppress the inhibition of the removal of the second process gas in the purge step S206. Further, by constantly supplying the purge gas, it is possible to suppress the generation of byproducts in the purge nozzle or the pressure equalizing part and suppress the backflow of the gas from the first purge nozzle 304a and the second purge nozzle 304b.
(Purge Step S204)

After the silicon-containing layer is formed on the wafer 200, the valve 243d of the first gas supply pipe 243a is closed to stop the supply of the DCS gas. At this time, while the APC valve 223 of the exhaust pipe 222 is in an open state, the interior of the process chamber 201 is vacuum exhausted by the vacuum pump 224, and the DCS gas remaining in the process chamber 201 that does not react or remain after contributing to the formation of the silicon-containing layer, is removed from the process chamber 201. In addition, the valve 246d is in an open state, and the supply of the $N_2$ gas as the inert gas into the process chamber 201 may be maintained. The $N_2$ gas, which is continuously supplied from the valve 246d, acts as a purge gas. Thus, the DCS gas, which remains in the first gas supply pipe 243a, the common gas supply pipe 242, and the process chamber 201 and does not react or remaining after contributing to the formation of the silicon-containing layer, may be more effectively removed.

Moreover, in this case, the gas remaining in the process chamber 201 or the gas rectifying part 234 may not completely be removed (the interior of the process chamber 201 may not completely be purged). When the gas remaining in the process chamber 201 is very small in amount, there is no adverse effect caused in subsequent steps performed thereafter. Here, the flow rate of the $N_2$ gas supplied into the process chamber 201 is not required to be high, and for example, approximately the same amount of the $N_2$ gas as the volume of the process chamber 201 may be supplied to perform the purge step such that there is no adverse effect generated in the subsequent step. As described above, as the interior of the process chamber 201 is not completely purged, the purge time may be reduced, thereby improving the throughput. In addition, the consumption of the $N_2$ gas may also be suppressed to a minimal necessity.

The temperature of the heater 213 at this time is set to a constant temperature within a range of, for example, 300 to 650 degrees Celcius, preferably, in a range of 300 to 600 degrees Celcius, or more preferably, in a range of 300 to 550 degrees Celcius, in the same manner as when the precursor gas is supplied to the wafer 200. A supply flow rate of the $N_2$ gas as the purge gas supplied from each inert gas supply system is set to fall within a range of, for example, 100 to 20000 sccm. The purge gas may include a rare gas such as an Ar gas, a He gas, a Ne gas, a Xe gas, and the like, in addition to the $N_2$ gas.
(Second Process Gas Supply Step S205)

After the residual DCS gas remaining in the process chamber 201 is removed, the supply of the purge gas is stopped, and the $NH_3$ gas as a reaction gas is supplied. Specifically, the valve 244d of the second gas supply pipe 244a is opened to flow the $NH_3$ gas into the second gas supply pipe 244a. The flow rate of the $NH_3$ gas flowing in the second gas supply pipe 244a is controlled by the MFC 244c. The flow-rate-controlled $NH_3$ gas is supplied to the wafer 200 through the common gas supply pipe 242 and the gas rectifying part 234. The $NH_3$ gas supplied onto the wafer 200 reacts with a silicon-containing layer formed on the wafer 200 to cause nitrification of the silicon, and impurities such as hydrogen, chlorine, hydrogen chloride and the like are discharged.

(Purge Step S206)

After the second process gas supply step, the supply of the reaction gas is stopped, and a processing that is the same as the purge step S204 is performed. By performing the purge step, a residual $NH_3$ gas that remains in the second gas supply pipe 244a, the common gas supply pipe 242, and the process chamber 201, and does not react or remaining after contributing to the nitriding of the silicon may be removed. As the residual gas is removed, it is possible to prevent an unexpected film from being formed by the residual gas.

(Repetition Step S207)

As the first process gas supply step S203, the purge step S204, the second process gas supply step S205, and the purge step S206 are respectively performed once, a silicon nitride (SixNy) film having a predetermined thickness is deposited on the wafer 200. By repeating these steps, it is possible to control the thickness of the silicon nitride film on the wafer 200. The number of times the steps are repeated is controlled until a predetermined film thickness is obtained.

(Substrate Unloading Step S208)

After the steps are performed a predetermined number of times in the repetition step S207, a substrate unloading step S208 is performed to unload the wafer 200 from the process chamber 201. Specifically, the temperature in the process chamber 201 is lowered to a temperature at which the wafer 200 may be unloaded from the process chamber 201 (unloadable temperature), and the interior of the process chamber 201 is purged with the inert gas to be adjusted to a pressure at which the wafer 200 may be transferred from the process chamber 201 (transferable pressure). After the pressure adjustment, the substrate support part 210 is lowered by the elevation mechanism 218, the lift pins 207 protrude from the through holes 214, and the wafer 200 is mounted on the lift pins 207. After the wafer 200 is mounted on the lift pins 207, the gate valve 205 is opened, and the wafer 200 is unloaded from the process chamber 201.

(3) Effects According to the Embodiment

According to the embodiments, one or more of the following effects are expected.

(a) It is possible to adjust the gas flow (conductance) in the circumferential direction at the outer periphery of the substrate.

(b) It is possible to improve the processing uniformity by adjusting the conductance in the circumferential direction.

(c) It is possible to finely adjust the conductance in the circumferential direction by increasing the number of pressure equalizing part partition plates.

(d) As the conductance adjustment gas is supplied from the first process gas supply step to the purge step after the second process gas supply step, it is possible to suppress the backflow of gas in the conductance adjustment part and suppress the generation of byproducts in the conductance adjusting part.

(e) In addition, by supplying the purge gas to the outer periphery side of the substrate, the process gas, which passes the substrate and is exhausted thereafter, may be diluted with the purge gas supplied to the outer periphery side of the substrate, and the generation of byproducts in the exhaust part may be suppressed.

<Other Embodiments>

Hereinabove, the first embodiment has been described in detail, but the present disclosure is not limited to the above-described embodiment and may be variously modified without departing from the spirit of the present disclosure.

Figure 8:
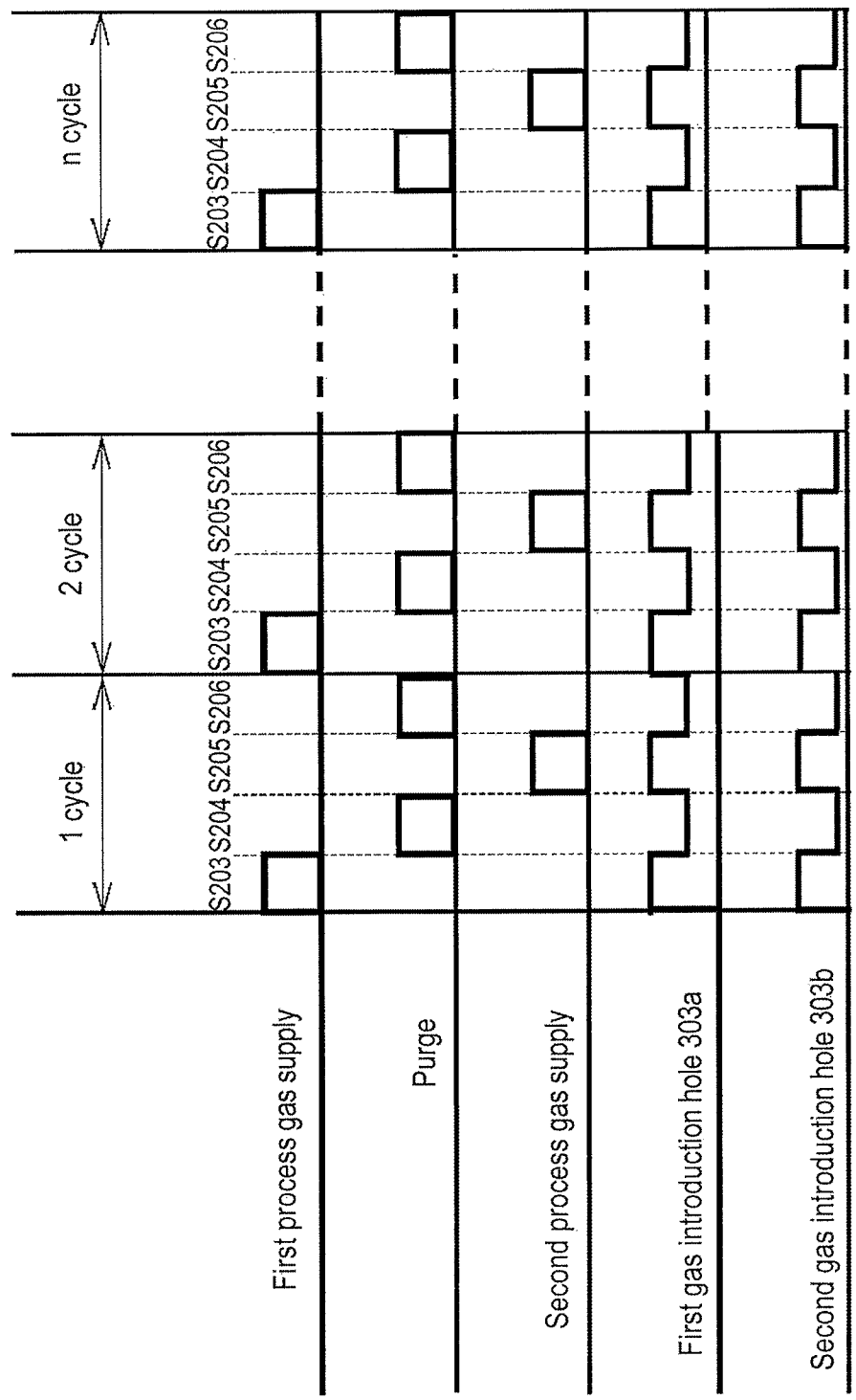
FIG. 8 shows a sequence of a substrate processing method according to one embodiment of the present disclosure.

For example, there is an exemplary gas supply sequence as shown in FIG. 8. FIG. 8 shows an example of supplying a purge gas with different flow rates respectively to the two purge regions formed in the outer periphery of the gas rectifying part 234. In the environment as shown in FIG. 2, the conductance in the first purge nozzle 304a side is greater than the conductance in the second purge nozzle 304b side. Accordingly, the flow rates of the first process gas and the second process gas flowing in the first purge nozzle 304a side is greater than the flow rates of the first process gas and the second process gas flowing in the second purge nozzle 304b side, and a film that is formed in the first purge nozzle 304a side and a film that is formed in the second purge nozzle 304b side are formed to have different properties. For example, a film of the first purge nozzle 304a side becomes thicker and has a high withstand voltage characteristic. In this case, for example, by setting the amount of the purge gas supplied to the first purge nozzle 304a to be greater than the amount of the purge gas supplied to the second purge nozzle 304b, it is possible to approximate the conductance of the first process gas, the second process gas, and the purge gas, which flow in the first purge nozzle 304a side, to the conductance of the first process gas, the second process gas, and the purge gas, which flow in the second purge nozzle 304b side. The amount of the gas supplied to the wafer 200 may be made uniform in the circumferential direction by approximating the conductance of the first purge nozzle 304a side to the conductance of the second purge nozzle 304b side. Thus, the properties of a film formed on the wafer 200 may be made uniform. While an example has been shown where the flow rate of the purge gas supplied to the first purge nozzle 304a is set to be greater than the flow rate of the purge gas supplied to the second purge nozzle 304b, the present disclosure is not limited thereto, and the flow rate of the second purge nozzle 304b side may be configured to be greater than that of the first purge nozzle 304a side.

Figure 9:
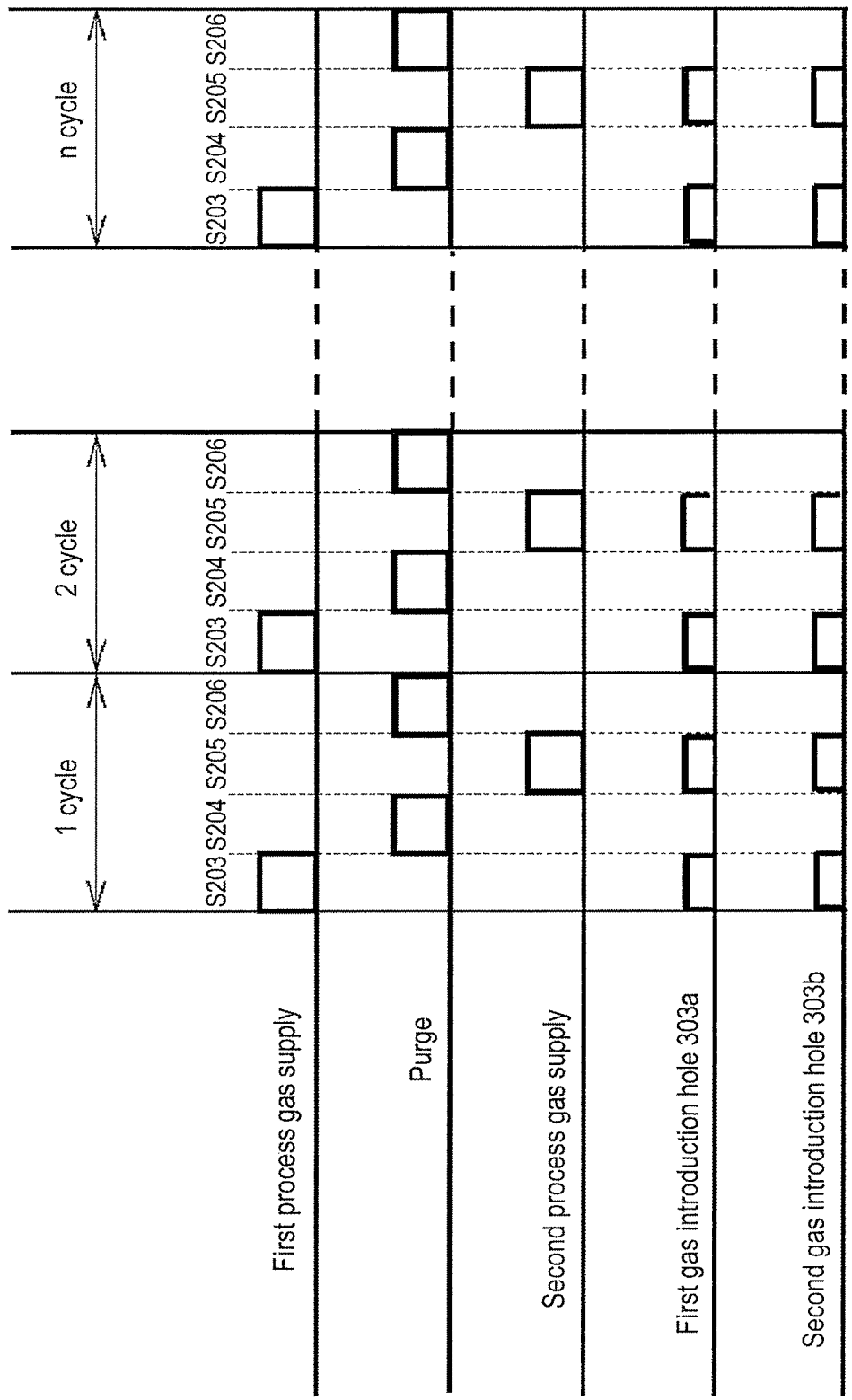
FIG. 9 shows a sequence of a substrate processing method according to one embodiment of the present disclosure.

In addition, as shown in FIG. 9, the system may be configured not to supply the purge gas to the purge region formed in the outer periphery of the gas rectifying part 234 in the purge step.

Further, while the amount of purge gas supplied to the conductance adjustment part is the same in step S203 and step S205 in the description above, the present disclosure is not limited thereto. For example, the flow rate in step S205 and the flow rate in step S203 may be different from each other. In this case, the flow rate in step S205 may be set to be greater than the flow rate in step S203. Among comparing the degree of activity of the first gas and the degree of activity of the second gas, the second gas may have a higher degree of activity, which may affect the processing uniformity for the substrate 200. It is possible to improve the processing uniformity by adjusting the conductance in the circumferential direction of the outer periphery of the substrate 200.

Moreover, while an example has been shown where the gas rectifying part 234 is inclined to either one side in the description above, the present disclosure is not limited thereto. For example, even if the gas rectifying part 234 and the substrate mounting stand 212 are parallel to each other, the first gas and the second gas may not be evenly exhausted. Such deviation of the exhaust changes according to the structure of the process chamber 201, the position of the exhaust port 206, or the like. For example, the first process gas may flow more into the first purge nozzle 304a side than the second purge nozzle 304b side, and the second process gas may flow more into the second purge nozzle 304b side than the first purge nozzle 304a side. In this case, it is possible to improve the processing uniformity for the wafer 200 by increasing the purge gas supplied to first purge nozzle 304a when the first process gas is supplied, and increasing the purge gas supplied to the second purge nozzle 304b when the second process gas is supplied. In addition, if the first process gas flows more into the second purge nozzle 304b side and the second process gas flows more into the first purge nozzle 304a side, it is possible to make the process uniform by supplying more purge gas to the second purge nozzle 304b when the first process gas is supplied, and supplying more purge gas to the first purge nozzle 304a when the second process gas is supplied.

Further, while the first purge nozzle 304a and the second purge nozzle 304b are installed over the entire outer periphery of the gas rectifying part 234 in the description above, the present disclosure is not limited thereto. For example, the nozzles may be arranged only in the direction where the exhaust port 221 of the process chamber is formed.

Figure 12:
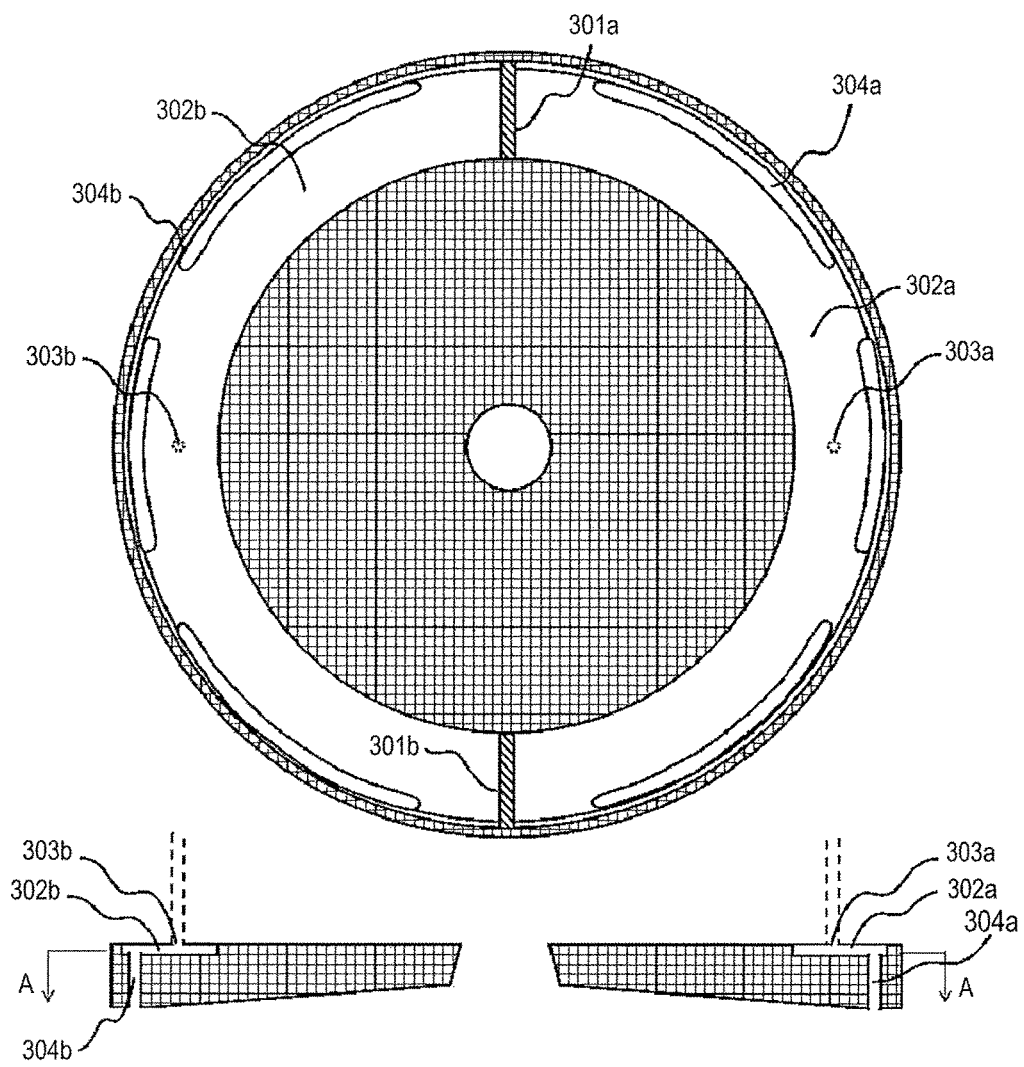
FIG. 12 shows an exemplary gas rectifying part and an exemplary conductance adjustment part according to one embodiment of the present disclosure.

In addition, while the first purge nozzle 304a and the second purge nozzle 304b of the conductance adjustment part are configured in a circular shape in the description above, the present disclosure is not limited thereto. For example, they may be configured in an elliptical shape or configured in an arc shape. In addition, they may be configured in a linear shape or configured in a slit shape as shown in FIG. 12. They may also be configured in a shape that matches the shape of the wafer 200. For example, they are configured to match the shape of the notch portion of the wafer (notch or orientation flat). It is possible to further improve the processing uniformity by configuring as above to match the shape of the substrate.

Moreover, while an example has been shown where the conductance adjustment part is installed in the gas rectifying part 234 in the description above, the present disclosure is not limited thereto, and the conductance adjustment part may be installed in the substrate mounting stand 212 or in the partition plate 204. As a result of further extensive research, the inventors have found that the problems described above may be solved by a method that is different from the means described above.

Figure 13:
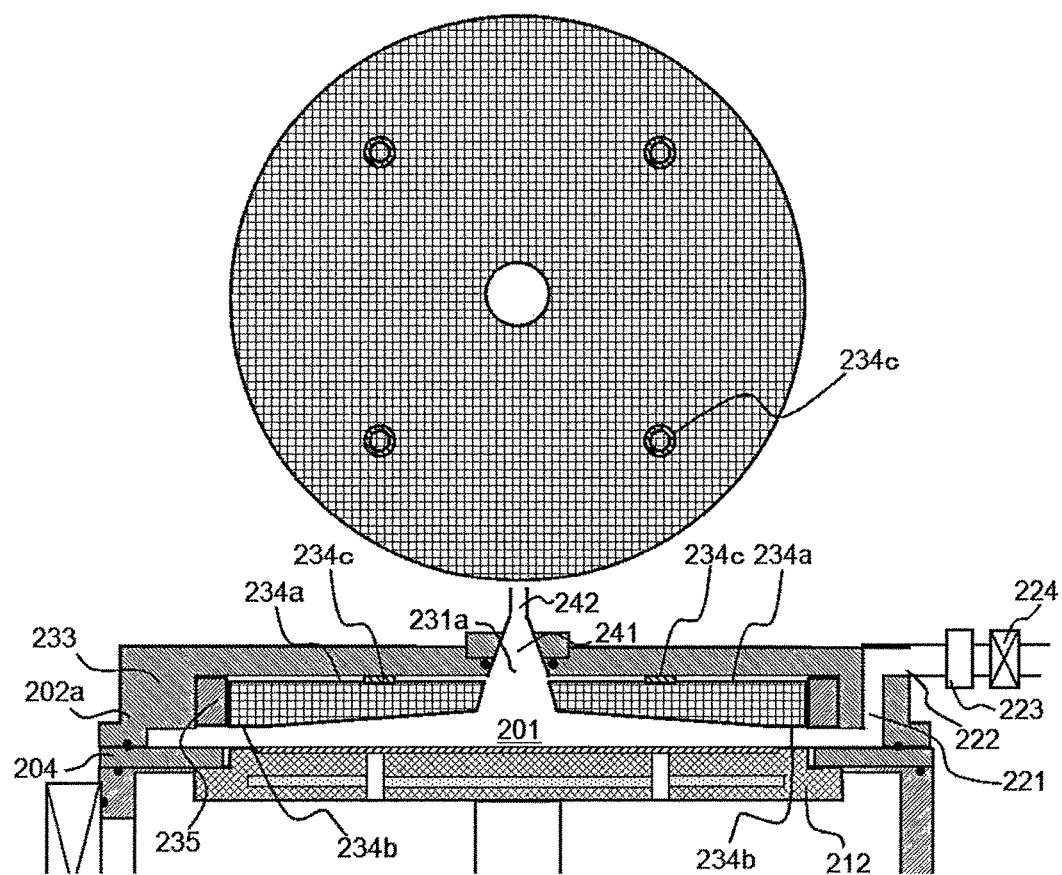
FIG. 13 shows an exemplary configuration of a gas rectifying part according to one embodiment of the present disclosure.

The details will be explained with reference to FIG. 13.

As described above, the processing uniformity for the wafer 200 is influenced by the parallelism between the gas rectifying part 234 and the substrate mounting stand 212. In particular, it becomes difficult to maintain the accuracy of the parallelism of the gas rectifying part 234. The parallelism of the gas rectifying part 234 is refers to the degree of parallelization between the upper surface 234a and the lower surface 234b (305) of the gas rectifying part 234. The upper surface 234a is formed to be larger than at least the area of the wafer 200, and therefore, when processing the upper surface 234a, it is difficult to form the entire upper surface 234a without slopes or uneven portions. Accordingly, a gas rectifying part support part 234c, which has the same area as the area of the lower surface 234b, is installed in the upper surface of the gas rectifying part 234 and connected to the lid 231, and thus the accuracy of the parallelism between the gas rectifying part support part 234c and the lower surface 234b may be easily maintained.

Figure 14:
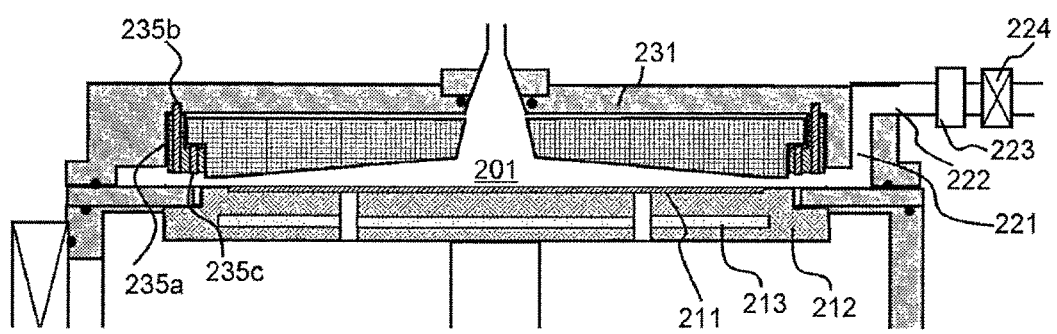
FIG. 14 shows an exemplary configuration of a gas rectifying part support mechanism according to one embodiment of the present disclosure.

As a result of further extensive research, the inventors have found that it is possible to improve the accuracy of the parallelism of the gas rectifying part 234 by installing a gas fastening member 235 as shown in FIG. 14.

The fastening member 235, which fastens the gas rectifying part, includes a fastening base material 235a, a fastening part 235b, and a height adjustment part 235c. The fastening base material 235a is fastened to the lid 231 by the fastening part 235b, and the gas rectifying part 234 is supported by being mounted on the fastening base material 235a. By raising or lowering the height adjustment part 235c, the slope of the gas rectifying part 234 may be adjusted, the parallelism between the substrate mounting stand 212 may be adjusted, and the conductance in the circumferential direction at the end of the wafer 200 may be adjusted.

Figure 15:
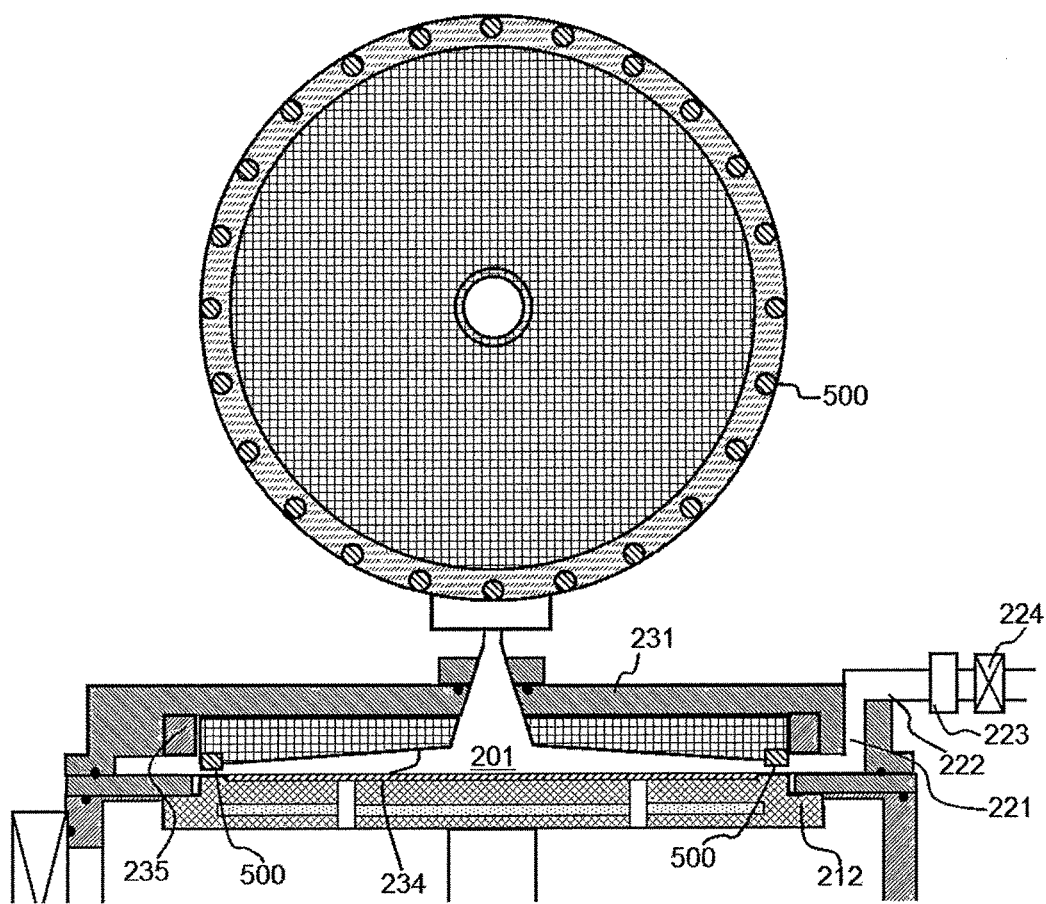
FIG. 15 shows an exemplary gas rectifying part and an exemplary conductance adjustment part according to one embodiment of the present disclosure.

As a result of further extensive research, the inventors have found that it is possible to adjust the conductance of the end portion of the wafer 200 and improve the processing uniformity by installing a conductance adjustment mechanism 500 as a second conductance adjustment part in the outer periphery of the gas rectifying part 234 as shown in FIG. 15. The conductance adjustment mechanism 500 is installed to be embedded in the outer periphery of the gas rectifying part. It is possible to adjust the conductance in the circumferential direction of the outer periphery of the wafer 200 by adjusting the length of conductance adjustment mechanism 500 that protrudes from the lower surface 234b (305) of the gas rectifying part 234. While the conductance adjustment mechanism 500 of this embodiment is configured with a plurality of projections, the present disclosure is not limited thereto. For example, the forming intervals may be shortened. In addition, it may be formed only in the side where the exhaust port 221 is formed. Further, rather than a projection shape, it may be configured in a ring shape so as to surround the wafer 200.

Hereinabove, while other embodiments of the present disclosure have been described, the present disclosure is not limited to the embodiment described above and various changes may be made without departing from the spirit of the disclosures.

While a process for manufacturing a semiconductor device has been described in the above, the present disclosure may be applied to processes other than the process for manufacturing a semiconductor device. For example, the present disclosure may be applied to a process for manufacturing a liquid crystal device, a process for plasma-processing a ceramic substrate, and the like.

Further, while the method for forming a film by alternately supplying the first gas (precursor gas) and the second gas (reaction gas) has been described above, the present disclosure may also be applied to other methods. For example, the precursor gas and the reaction gas may be supplied such that supply timings thereof overlap each other.

Furthermore, the precursor gas and the reaction gas may be supplied to be used in a CVD film-forming method.

Moreover, while a film forming process has been described above, the present disclosure may also be applied to other processes. For example, the present disclosure may be applied to substrate processing such as plasma oxidation processing or plasma nitriding processing of a substrate surface or a film formed on a substrate using either or both of the precursor gas and the reaction gas. In addition, the present disclosure may also be applied to substrate processing such as thermal processing or plasma annealing processing using either or both of the precursor gas and the reaction gas. In the plasma processing, the deviation of plasma or the deviation of the activated gas may be made uniform.

Further, while improvement of the processing uniformity has been described above, the present disclosure is not limited thereto. Recently, it is required to form, for example, a film having different film qualities or thickness at the inner periphery side and the outer side in the surface interior of the wafer 200. By adjusting the conductance in the outer periphery of the wafer 200, it is possible to have different gas conductance between the inner periphery side and the outer periphery side of the wafer. Consequently, it is possible to form a film with different film qualities or different thickness between the inner periphery side and the outer periphery side of the wafer 200. For example, it is possible to form a film having different film qualities between the inner periphery side and the outer periphery side of the wafer 200 by setting the flow rate of the purge gas, which is supplied to the conductance adjustment part, to be different between 1 to n cycles, or in odd cycles and even cycles of the substrate processing process. Otherwise, it is possible to form a film having different film qualities by increasing or decreasing the flow rate of the purge gas in the middle of a predetermined cycle.

<Aspects of the Present Disclosure>

Hereinafter, preferable aspects of the present disclosure will be additionally stated.

<Supplementary Note 1>

According to an aspect of the present disclosure, there is provided a substrate processing apparatus, including: a process chamber configured to accommodate a substrate; a substrate support part having the substrate mounted thereon; a first gas supply part configured to supply a first gas to the substrate; a second gas supply part configured to supply a second gas to the substrate; and a conductance adjustment part installed with a gas pressure equalizing part configured to equalize a pressure of a purge gas supplied from a plurality of locations, wherein the conductance adjustment part is configured to supply the purge gas having a equalized pressure in the gas pressure equalizing part to an outer periphery end side of the substrate support part, and adjust an exhaust conductance of any one of at least the first gas and the second gas.

<Supplementary Note 2>

In the substrate processing apparatus according to Supplementary Note 1, preferably, the gas pressure equalizing part includes at least two gas pressure equalizing spaces.

<Supplementary Note 3>

The substrate processing apparatus according to Supplementary Note 1 or 2, preferably, including a gas rectifying part installed in the upper side of the substrate support part and configured to rectify the first gas and the second gas.

<Supplementary Note 4>

In the substrate processing apparatus according to any one of Supplementary Notes 1 to 3, preferably, the conductance adjustment part is installed in the outer periphery end of the gas rectifying part.

<Supplementary Note 5>

The substrate processing apparatus according to any one of Supplementary Notes 1 to 4, preferably, including a purge gas supply part configured to supply different amount of purge gas to each of the at least two gas pressure equalizing spaces.

<Supplementary Note 6>

In the substrate processing apparatus according to any one of Supplementary Notes 1 to 5, preferably, a lower surface of the gas rectifying part and an upper surface of the substrate support part are installed in different parallel planes.

<Supplementary Note 7>

The substrate processing apparatus according to any one of Supplementary Notes 1 to 6, preferably, installed with a control part configured to control the first gas supply part, the second gas supply part, and the conductance adjustment part such that a purge gas is supplied with a first flow rate to the conductance adjustment part in an act of supplying the first gas to the substrate, a purge gas is supplied with the first flow rate to the conductance adjustment part in an act of supplying the second gas to the substrate, and a purge gas is supplied with a second flow rate to the conductance adjustment part in an act where the first gas and the second gas are not supplied to the substrate.

<Supplementary Note 8>

In the substrate processing apparatus according to Supplementary Note 7, preferably, the first flow rate is greater than the second flow rate.

<Supplementary Note 9>

The substrate processing apparatus according to any one of Supplementary Notes 1 to 6, preferably, installed with a control part configured to control the first gas supply part, the second gas supply part, and the conductance adjustment part such that a purge gas is supplied with a third flow rate and a fourth flow rate to the conductance adjustment part in an act of supplying the first gas to the substrate, a purge gas is supplied with a third flow rate and a fourth flow rate to the conductance adjustment part in an act of supplying the second gas to the substrate, and a purge gas is supplied with a fifth flow rate and a sixth flow rate to the conductance adjustment part in an act where the first gas and the second gas are not supplied to the substrate.

<Supplementary Note 10>

In the substrate processing apparatus according to Supplementary Note 9, preferably, the third flow rate is greater the fourth flow rate, and the fourth flow rate is greater than the fifth flow rate and the sixth flow rate.

<Supplementary Note 11>

In the substrate processing apparatus according to any one of Supplementary Notes 1 to 10, preferably, the gas rectifying part is mounted to a lid of the process chamber by a gas rectifying part support part installed in an upper surface of the gas rectifying part.

<Supplementary Note 12>

In the substrate processing apparatus according to any one of Supplementary Notes 1 to 10, preferably, the gas rectifying part is configured such that a distance between a lower surface and the substrate support part upper surface is adjustable by a gas rectifying part fastening member installed in the side of the gas rectifying part.

<Supplementary Note 13>

In the substrate processing apparatus according to any one of Supplementary Notes 1 to 12, preferably, a second conductance adjustment mechanism is installed in a lower surface of the gas rectifying part.

<Supplementary Note 14>

According to another aspect of the present disclosure, there is provided a method of manufacturing a semiconductor device, including: accommodating a substrate into a process chamber, mounting the substrate on the substrate support part; supplying a first gas to the substrate, supplying a second gas to the substrate; and by using a gas pressure equalizing part for equalizing the pressure of a purge gas supplied from a plurality of locations, supplying the purge gas having a equalized pressure in the gas pressure equalizing part to an outer periphery end side of the substrate support part, and adjusting an exhaust conductance of at least one of the first gas and the second gas.

<Supplementary Note 15>

In the method of manufacturing a semiconductor device according to Supplementary Note 14, preferably, the gas pressure equalizing part includes at least two gas pressure equalizing spaces, the method further including setting different flow rates of a purge gas supplied to each of the gas pressure equalizing spaces.

<Supplementary Note 16>

The method of manufacturing a semiconductor device according to Supplementary Note 14 or 15, preferably, including a gas rectifying part between the substrate support part, and a first gas supply part configured to supply the first gas and a second gas supply part configured to supply the second gas, and a conductance adjustment part including the gas pressure equalizing part is installed in an outer periphery end of the gas rectifying part.

<Supplementary Note 17>

In the method of manufacturing a semiconductor device according to any one of Supplementary Note 14 to 16, preferably, in an act of supplying the purge gas, the gas pressure equalizing part includes at least a first gas pressure equalizing space and a second gas pressure equalizing space, and the flow rates of the purge gas supplied to the first gas pressure equalizing space and the second gas pressure equalizing space are set to be different.

<Supplementary Note 18>

In the method of manufacturing a semiconductor device according to any one of Supplementary Note 14 to 17, preferably, in an outer periphery end of the substrate support part and in a circumferential direction, at least two regions having different conductances are formed, and the two regions having different conductances respectively correspond to the divided gas pressure equalizing part.

<Supplementary Note 19>

The method of manufacturing a semiconductor device according to any one of Supplementary Note 14 to 18, preferably, including supplying a purge gas with a first flow rate to the conductance adjustment part in an act of supplying the first gas, supplying the purge gas with the first flow rate to the conductance adjustment part in an act of supplying the second gas, and supplying the purge gas with the second flow rate to the conductance adjustment part in an act where the first gas and the second gas are not supplied to the substrate.

<Supplementary Note 20>

In the method of manufacturing a semiconductor device according to Supplementary Note 19, preferably, the first flow rate is greater than the second flow rate.

<Supplementary Note 21>

The method of manufacturing a semiconductor device according to any one of Supplementary Note 14 to 18, preferably, including, supplying a purge gas with a third flow rate and a fourth flow rate to the conductance adjustment part in an act of supplying the first gas, supplying a purge gas with a third flow rate and a fourth flow rate to the conductance adjustment part in an act of supplying the second gas, and supplying a purge gas with a fifth flow rate and a sixth flow rate to the conductance adjustment part in an act where the first gas and the second gas are not supplied to the substrate.

<Supplementary Note 22>

In the method of manufacturing a semiconductor device according to Supplementary Note 21, preferably, the third flow rate is greater the fourth flow rate, and the fourth flow rate is greater than the fifth flow rate and the sixth flow rate.

<Supplementary Note 23>

According to still another aspect of the present disclosure, there is provided a program that causes a computer to perform processes of: accommodating a substrate into a process chamber, mounting the substrate on the substrate support part; supplying a first gas to the substrate, supplying a second gas to the substrate; and by using a gas pressure equalizing part for equalizing the pressure of a purge gas supplied from a plurality of locations, supplying the purge gas having a equalized pressure in the gas pressure equalizing part to an outer periphery end side of the substrate support part, and adjusting an exhaust conductance of at least one of the first gas and the second gas.

<Supplementary Note 24>

According to still another aspect of the present disclosure, there is provided a non-transitory computer-readable recording medium storing a program that causes a computer to perform processes of: accommodating a substrate into a process chamber, mounting the substrate on the substrate support part; supplying a first gas to the substrate, supplying a second gas to the substrate; and by using a gas pressure equalizing part for equalizing the pressure of a purge gas supplied from a plurality of locations, supplying the purge gas having a equalized pressure in the gas pressure equalizing part to an outer periphery end side of the substrate support part, and adjusting an exhaust conductance of at least one of the first gas and the second gas.

<Supplementary Note 25>

According to still another aspect of the present disclosure, there is provided a gas rectifying part, which is installed in a substrate processing apparatus having a process chamber installed with a substrate support part configured to support a substrate, including: an opening through which a first gas and a second gas supplied to the substrate pass; and a conductance adjustment part installed with a gas pressure equalizing part configured to equalize the pressure of a purge gas supplied from a plurality of locations, wherein the conductance adjustment part is configured to supply the purge gas having a equalized pressure in the gas pressure equalizing part to an outer periphery end side of the substrate support part.

<Supplementary Note 26>

In the gas rectifying part according to Supplementary Note 25, preferably, the gas pressure equalizing part includes at least two gas pressure equalizing spaces.

<Supplementary Note 27>

In the gas rectifying part according to Supplementary Note 25 or 26, preferably, the conductance adjustment part is installed in an outer periphery end of the gas rectifying part.

<Supplementary Note 28>

In the gas rectifying part according to any one of Supplementary Note 25 to 27, preferably, the gas pressure equalizing part includes at least a first gas pressure equalizing space and a second gas pressure equalizing space, and a purge gas with different flow rates is supplied to the first gas pressure equalizing space and the second gas pressure equalizing space.

<Supplementary Note 29>

The gas rectifying part according to any one of Supplementary Note 25 to 28, preferably, is mounted to a lid of the process chamber by a gas rectifying part support part installed in an upper surface of the gas rectifying part.

<Supplementary Note 30>

The gas rectifying part according to any one of Supplementary Note 25 to 28, preferably, is configured such that a distance between a lower surface and the substrate support part upper surface is adjustable by a gas rectifying part fastening member installed in the side of the gas rectifying part.

<Supplementary Note 31>

In the gas rectifying part according to any one of Supplementary Note 25 to 28, preferably, a second conductance adjustment mechanism is installed in a lower surface of the gas rectifying part.

According to the present disclosure in some embodiments, there may be provided a substrate processing apparatus, a method of manufacturing a semiconductor device, and a gas rectifying part, which makes it possible to improve the processing uniformity for a substrate surface interior and the properties of a film that is formed on a substrate, and to improve the manufacturing throughput as well.

While certain embodiments have been described, these embodiments have been presented by way of example only, and are not intended to limit the scope of the disclosures. Indeed, the methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a process chamber including a process space configured to accommodate a substrate;
a substrate support part installed in the process chamber, the substrate support part including a substrate mounting stand;
a first gas supply part configured to supply a first gas to the substrate;
a second gas supply part configured to supply a second gas to the substrate;
a gas introduction port installed in the process chamber, the gas introduction port being configured to introduce a gas from the first gas supply part or the second gas supply part;
a gas rectifying part installed between the gas introduction port and the process space, the gas rectifying part including:
an opening through which the gas introduced from the gas introduction port passes;
a first purge nozzle formed in a first periphery region of the gas rectifying part between a first gas pressure equalizing space in the gas rectifying part and a first portion of an outer periphery of the substrate mounting stand; and
a second purge nozzle formed in a second periphery region of the gas rectifying part between a second gas pressure equalizing space in the gas rectifying part and a second portion of the outer periphery of the substrate mounting stand;
a gas flow passage communicating with the opening and formed between the gas rectifying part and the outer periphery of the substrate mounting stand in a circumferential direction, the gas flow passage having a first height formed between a lower end of the first purge nozzle and the first portion of the outer periphery of the substrate mounting stand and a second height formed between a lower end of the second purge nozzle and the second portion of the outer periphery of the substrate mounting stand, and the first height being higher than the second height;
a first purge gas supply part connected to the first purge nozzle and configured to supply a first amount of a purge gas onto the first portion of the outer periphery of the substrate mounting stand through the first purge nozzle in a direction of the first height; and
a second purge gas supply part connected to the second purge nozzle and configured to supply a second amount of the purge gas onto the second portion of the outer periphery of the substrate mounting stand through the second purge nozzle in a direction of the second height,
the first amount of the purge gas being larger than the second amount of the purge gas.

2. The substrate processing apparatus of claim 1, further comprising a conductance adjustment part including the first gas pressure equalizing space and the second gas pressure equalizing space,
wherein the conductance adjustment part is installed in an outer periphery end of the gas rectifying part.

3. The substrate processing apparatus of claim 2, further comprising a control part configured to control the first gas supply part, the second gas supply part, and the conductance adjustment part such that,
the purge gas is supplied to the conductance adjustment part at a first flow rate when the first gas is supplied to the substrate,
the purge gas is supplied to the conductance adjustment part at the first flow rate when the second gas is supplied to the substrate, and
the purge gas is supplied to the conductance adjustment part at a second flow rate when the first gas and the second gas are not supplied to the substrate.

4. The substrate processing apparatus of claim 3, wherein the control part is configured to control the first flow rate to be greater than the second flow rate.

5. The substrate processing apparatus of claim 4, wherein the control part is further configured to control the first gas supply part, the second gas supply part, and the conductance adjustment part such that,
the purge gas is supplied to the conductance adjustment part at a third flow rate and a fourth flow rate when the first gas is supplied to the substrate,
the purge gas is supplied to the conductance adjustment part at the third flow rate and the fourth flow rate when the second gas is supplied to the substrate, and
the purge gas is supplied to the conductance adjustment part at a fifth flow rate and a sixth flow rate when the first gas and the second gas are not supplied to the substrate.

6. The substrate processing apparatus of claim 5, wherein the control part is further configured to control the third flow rate to be greater than the fourth flow rate and control the fourth flow rate to be greater than the fifth flow rate and the sixth flow rate.

7. The substrate processing apparatus of claim 6, wherein a conductance adjustment mechanism is installed in a lower surface of the gas rectifying part.

8. The substrate processing apparatus of claim 1, further comprising:
a conductance adjustment part including the first gas pressure equalizing space and the second gas pressure equalizing space; and
a control part configured to control the first gas supply part, the second gas supply part, and the conductance adjustment part such that,
the purge gas is supplied to the conductance adjustment part at a first flow rate when the first gas is supplied to the substrate,
the purge gas is supplied to the conductance adjustment part at the first flow rate when the second gas is supplied to the substrate, and
the purge gas is supplied to the conductance adjustment part at a second flow rate when the first gas and the second gas are not supplied to the substrate.

9. The substrate processing apparatus of claim 8, wherein the control part is further configured to control the first flow rate to be greater than the second flow rate.

10. The substrate processing apparatus of claim 9, wherein the control part is further configured to control the first gas supply part, the second gas supply part, and the conductance adjustment part such that, the purge gas is supplied to the conductance adjustment part at a third flow rate and a fourth flow rate when the first gas is supplied to the substrate, the purge gas is supplied to the conductance adjustment part at the third flow rate and the fourth flow rate when the second gas is supplied to the substrate, and the purge gas is supplied to the conductance adjustment part at a fifth flow rate and a sixth flow rate when the first gas and the second gas are not supplied to the substrate.

11. The substrate processing apparatus of claim 10, wherein the control part is further configured to control the third flow rate to be greater than the fourth flow rate and control the fourth flow rate to be greater than the fifth flow rate and the sixth flow rate.

12. The substrate processing apparatus of claim 11, wherein a conductance adjustment mechanism is installed in a lower surface of the gas rectifying part.

13. The substrate processing apparatus of claim 8, wherein the control part is further configured to control the first gas supply part, the second gas supply part, and the conductance adjustment part such that, the purge gas is supplied to the conductance adjustment part at a third flow rate and a fourth flow rate when the first gas is supplied to the substrate, the purge gas is supplied to the conductance adjustment part at the third flow rate and the fourth flow rate when the second gas is supplied to the substrate, and the purge gas is supplied to the conductance adjustment part at a fifth flow rate and a sixth flow rate when the first gas and the second gas are not supplied to the substrate.

14. The substrate processing apparatus of claim 13, wherein the control part is further configured to control the third flow rate to be greater than the fourth flow rate and control the fourth flow rate to be greater than the fifth flow rate and the sixth flow rate.

15. The substrate processing apparatus of claim 14, wherein a conductance adjustment mechanism is installed in a lower surface of the gas rectifying part.

16. The substrate processing apparatus of claim 1, wherein a conductance adjustment mechanism is installed in a lower surface of the gas rectifying part.

* * * * *